US006226782B1

(12) United States Patent
Nowak et al.

(10) Patent No.: US 6,226,782 B1
(45) Date of Patent: *May 1, 2001

(54) APPARATUS FOR AUTOMATED PILLAR LAYOUT

(75) Inventors: Edward D. Nowak, Pleasanton; Subhas Bothra, San Jose, both of CA (US)

(73) Assignee: Philips Electronics North America Corp., New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/304,886

(22) Filed: May 4, 1999

Related U.S. Application Data

(62) Division of application No. 08/838,020, filed on Apr. 22, 1997, now Pat. No. 6,013,536.

(51) Int. Cl.[7] .................................................... G06F 17/00
(52) U.S. Cl. ............................ 716/19; 438/14; 438/17; 438/128
(58) Field of Search ...................... 716/19, 21; 438/17, 438/14, 128

(56) References Cited

U.S. PATENT DOCUMENTS

| 5,117,276 | 5/1992 | Thomas et al. ...................... 257/758 |
| 5,171,713 | 12/1992 | Matthews .............................. 438/31 |
| 5,530,280 | 6/1996 | White ................................... 257/508 |
| 5,565,707 | 10/1996 | Colgan et al. ....................... 257/762 |
| 5,567,982 | 10/1996 | Bartelink .............................. 257/664 |
| 5,751,012 | * 5/1998 | Wolstenholme et al. ................. 257/5 |
| 5,798,559 | * 8/1998 | Bottra et al. .......................... 257/522 |
| 5,933,742 | * 8/1999 | Wu ....................................... 438/398 |
| 5,953,626 | * 9/1999 | Hause et al. ......................... 438/622 |
| 6,057,224 | * 5/2000 | Bottra et al. .......................... 438/619 |

OTHER PUBLICATIONS

S. Bothra, B. Rogers, M. Kellam, and C.M. Osburn, "Analysis of the Effects of Scaling on Interconnect Delay in ULSI Circuits," IEEE Transactions on Electron Devices, vol. 40, No. 3, Mar. 1993.

M.E. Thomas, J.A. Saadat, and S. Sekigahama, "VLSI Multilevel Micro–Coaxial Interconnects for High Speed Devices," Fairchild Research Center, National Semiconductor Corp., Santa Clara, CA, CH2865–4/90/0000–0055 1990 IEEE.

* cited by examiner

Primary Examiner—Matthew Smith
Assistant Examiner—Vuthe Siek
(74) Attorney, Agent, or Firm—Martine Penilla & Kim, LLP

(57) ABSTRACT

Disclosed is an apparatus for generating mask data suitable to produce a support pillar mask used in air dielectric interconnect structures. The apparatus includes a mask data scanner configured to select features having an interconnect dimension from a first mask. The features having the interconnect dimension being defined to electrically interconnect devices distributed on a substrate. The apparatus further includes a mask data comparing engine for comparing mask data associated with an intermediate support pattern and mask data associated with the features having the interconnect dimension selected by the mask data scanner. The comparing being configured to identify a mask area where the intermediate support pattern and the features having the interconnect dimension overlap. Preferably, the identified mask area defines the location of a plurality of pillars.

6 Claims, 21 Drawing Sheets

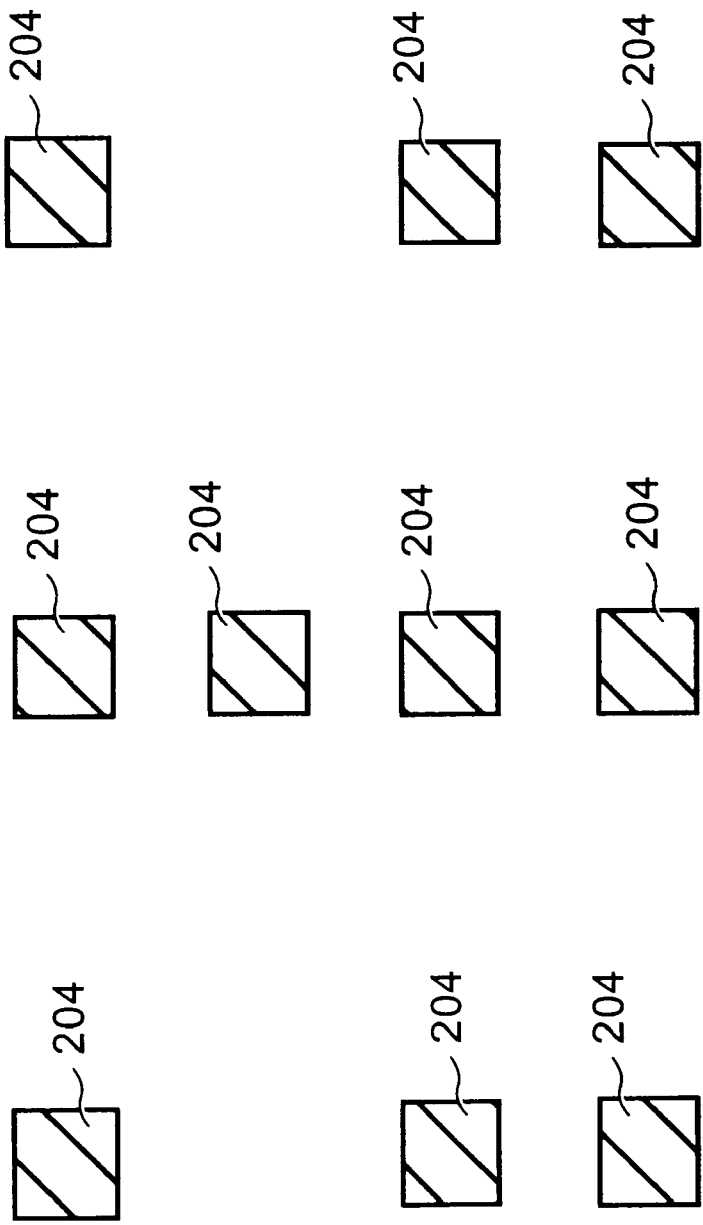

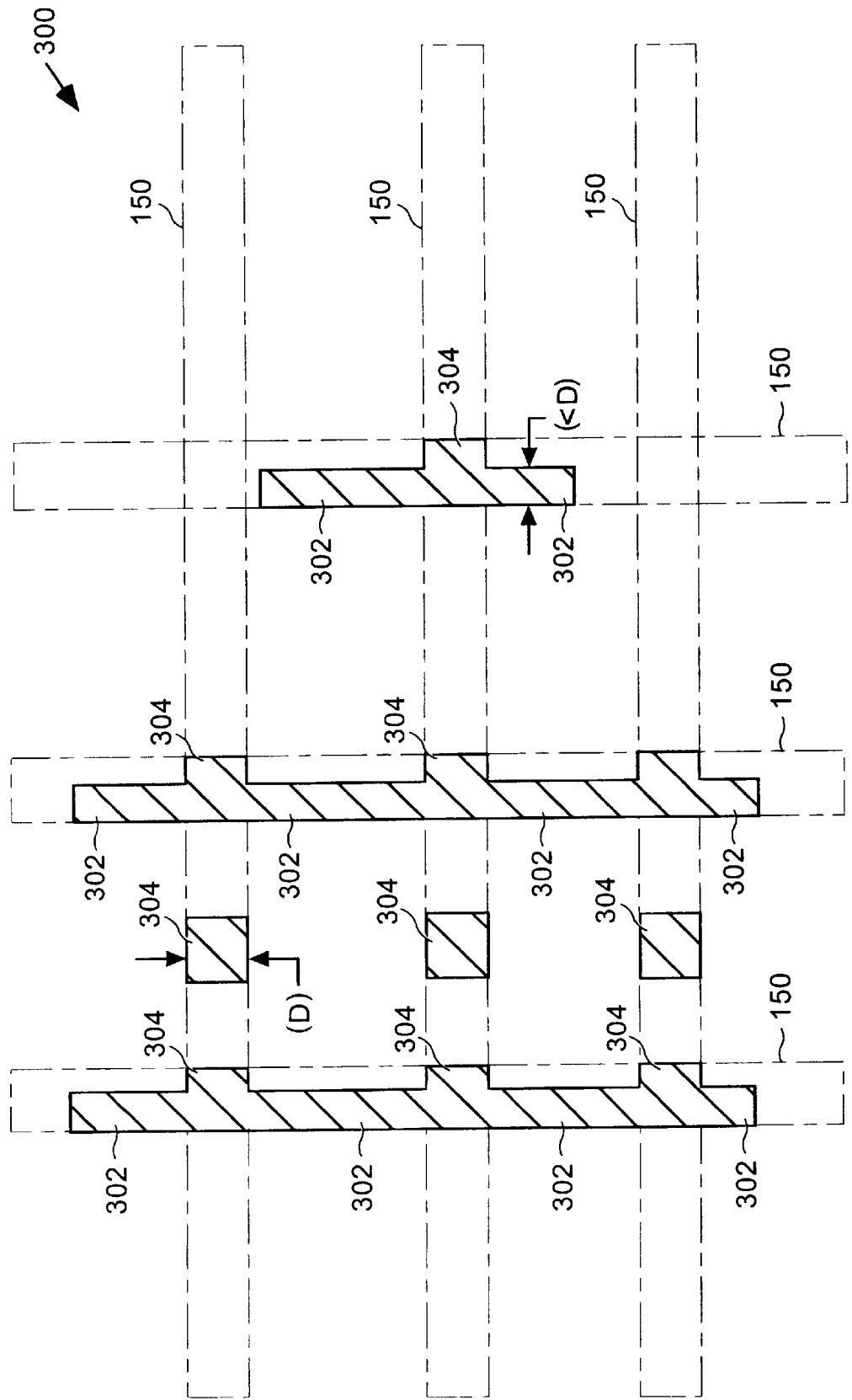

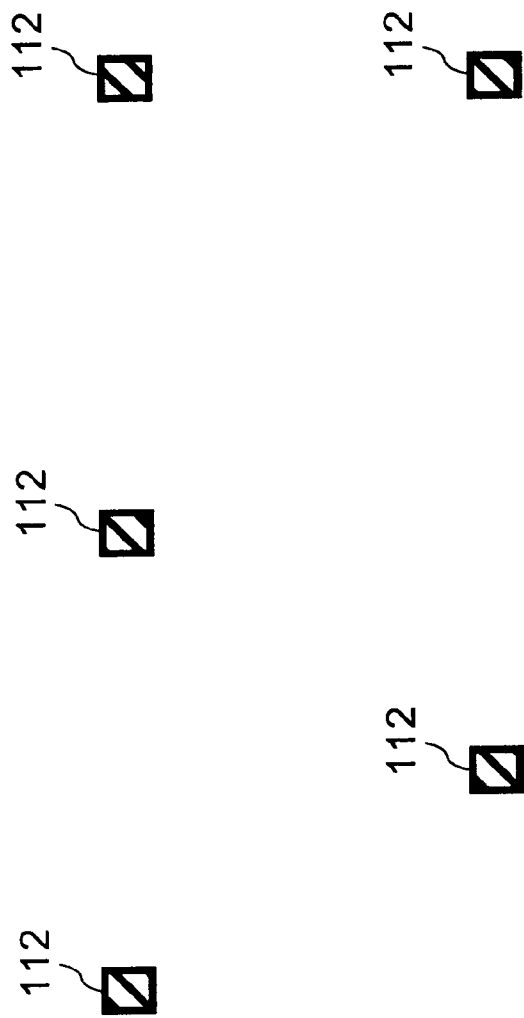

APPARATUS FOR AUTOMATED PILLAR LAYOUT

CROSS REFERENCE TO RELATED APPLICATIONS

This is a divisional application of prior application Ser. No. 08/838,020 filed on Apr. 22, 1997 now U.S. Pat. No. 6,013,536.

This application is related to a co-pending and commonly assigned U.S. patent application having U.S. Ser. No. 08/623,883, and entitled "Integrated Circuit Structure With Air Dielectric And Method For Making Same," is incorporated herein by reference.

BACKGROUND OF THE INVENTION

1. Field of the Invention

The present invention relates generally to integrated circuits and, more particularly, to computer automated methods for designing support pillar masks used in fabricating air dielectric interconnect structures.

2. Description of the Related Art

Interconnect structures of integrated circuits (ICs) generally take the form of patterned metallization lines that are used to electrically interconnect devices and to provide interconnection with external circuitry. By way of example, IC devices may include metal oxide semiconductor ("MOS") devices having diffused source and drain regions separated by channel regions, and gates located over the channel regions. In practice, an IC chip may include thousands or millions of devices such as MOS transistors.

Conventionally, a dielectric layer is deposited over the devices and via holes are formed through the dielectric layer to the devices below. After the via holes are etched through the dielectric layer, a metallization layer is deposited over the dielectric surface filling the via holes to define metal filled vias. After the first metallization layer has been deposited, it is patterned to form interconnect metallization lines. As is well known in the art, "patterning" may be accomplished by depositing a photoresist layer, selectively exposing the photoresist to light, developing the photoresist to form an etch mask, and etching the exposed metallization to pattern the metallization layer, and removing the etch mask. This process may then be repeated if additional layers of metallization lines are desired.

As the demand for faster, more complex and compact IC chips increases, the performance of the interconnects has become increasingly important. Although individual transistor speeds have continued to improve by implementing shorter gate lengths and less resistive gate electrodes, improvements in interconnect structure speed has lagged.

As is well known in the art, the speed of interconnect structures is generally characterized in terms of RC delays (i.e., resistance/capacitance timing delays). Therefore, efforts at reducing RC delays in interconnect structures have involved experimentation with dielectric materials to reduce capacitance and with metals to reduce resistance. As is well known in the art, different metals have different resistivities, and each have different IC fabrication benefits and drawbacks. By way of example, the resistance of copper (Cu) and silver (Ag) are relatively lower than aluminum (Al), but these metals are known to be more susceptible to corrosion. In addition, lowering the resistance of metal interconnect lines typically does not result in as great a benefit as reducing interconnect capacitance since all metals have relatively low resistance.

As is well known in the art, the capacitance associated with an interconnect structure is directly proportional to the dielectric constant ($\epsilon_o$) of the dielectric layer lying between the "plates" of the capacitor, i.e., adjacent metallization layers (i.e., $C \alpha \epsilon_o$). Therefore, interconnect capacitance may be reduced by lowering the dielectric constant of the material lying between metallization lines. Conventionally, silicon dioxide having a dielectric constant of about 4.0 is used to isolate the various interconnect metallization lines in IC chips. However, there have been various unsuccessful attempts at reducing capacitance by developing low dielectric materials. Such materials include organic-type dielectrics which have dielectric constants between about 2.0 and 4.0.

Unfortunately, the use of organic-type dielectrics present various fabrication difficulties. By way of example, fabrication difficulties may include excessive moisture uptake, increased susceptibility to sodium contamination, and a lack of global planarization schemes available to planarize organic-type dielectric materials. As a result, many IC manufactures avoid excessive cost and time consuming fabrication processes associated with organic-type dielectrics.

Air has a dielectric constant of about 1.0. Although it is well known that air has a low dielectric constant, there are significant difficulties associated with constructing multi-level interconnect structures utilizing air as a dielectric, including the complex task of providing mechanical support for stacked metallization layers during fabrication. As a result, in the past, fabricating interconnect structures with air as a dielectric (if at all possible) was prohibitively expensive as compared to the benefits of increased circuit speeds attributed to low dielectric constants.

FIGS. 1A and 1B represent a cross-sectional view and a top view, respectively of a prior art interconnect structure 12 having a suspended portion 14 over a silicon substrate 10. For a more detailed description of the steps associated with fabricating this prior art interconnect structure, reference may be made to a paper entitled "VLSI Multilevel Micro-Coaxial Interconnects for High Speed Devices" by M. E. Thomas, et al., Fairchild Research Center, National Semiconductor Corporation, Santa Clara, Calif., IEDM Tech. Dig., pages 55–58 (1990), which is hereby incorporated by reference. Interconnect structure 12 includes an inner conductor 20, a insulating dielectric coating 18 and an outer conductive layer 16 that serves to encapsulate the insulating dielectric coating 18. Interconnect structure 12 also includes two contact posts 13 fabricated to have a larger dimension so as to support suspended portion 14.

It should be noted that the suspended portion 14 tends to sag under the influence of gravity. Therefore, there is a limit to the suspended length of such structures before they fracture and break, which is a significant practical problem in implementing this prior art structure. Another problem encountered with the interconnect structure of FIG. 1A is the inability to stack multiple interconnect layers. By way of example, if a second interconnect structures were built over structure 12, the probability of breaking center region 14 dramatically increases due to the lack of mechanical support under center region 14.

Although the benefits of using air as a dielectric for interconnect structures is well known, most designers still avoid air as the dielectric in densely integrated devices because the special masks used for designing "pillars" that support the thousands or sometimes millions of suspended interconnect lines can be a very labor intensive task that is often times prohibitively expensive. By way of example, a current technique used for laying out the multitude of interconnect lines needed to complete the transistor interconnections in an application specific integrated circuit (ASIC), is to utilize well known "place and route" software tools.

This is especially useful in gate array masterslice devices where thousands of identical base cells, each having a standard transistor pattern, need many interconnect lines to complete the ASIC device. Once the "place and route" software tool designs the interconnect lines needed to complete the ASIC device, if air is desired as the dielectric, designers are generally required to manually design special masks used to fabricate the support pillars to mechanically support the suspended interconnect lines at various locations. Unfortunately, for large scale ASIC devices, the number of suspended interconnect lines may number in the thousands or millions. As a result, most designers are typically required to spend many months studying and inspecting the interconnect line layouts to determine the appropriate locations for the thousands or millions of support pillars needed in an air dielectric interconnect structure.

In view of the foregoing, what is needed is a computer an automated method and apparatus for designing interconnect mask layouts for fabricating support pillars used to mechanically support air dielectric interconnect structures.

SUMMARY OF THE INVENTION

Broadly speaking, the present invention fills these needs by providing methods an apparatuses for automating the mask layout design of pillar structures used in air dielectric interconnect structures. It should be appreciated that the present invention can be implemented in numerous ways, including as a process, an apparatus, a system, a device, a computer readable medium or a method. Several inventive embodiments of the present invention are described below.

In one embodiment, a method for automating support pillar layout for air dielectric interconnect structures is disclosed. The method includes selecting features having an interconnect dimension from a first mask. The features having the interconnect dimension being configured to electrically interconnect devices distributed on a substrate. The method further includes providing an intermediate support pattern that defines a predetermined spacing for a pillar mask layout. Identifying overlap regions where the features having an interconnect dimension selected from the first mask overlap the intermediate support pattern. The overlap regions defining pillar locations in the pillar mask layout.

In another embodiment, a method for automating support pillar design in air dielectric interconnect structures is disclosed. The method includes selecting features having an interconnect dimension from a first mask. Providing an intermediate support pattern defining a pillar spacing. Identifying overlap regions where the features selected from the first mask overlap the intermediate support pattern. The method further including filtering the overlap regions to eliminate features that are less than the interconnect dimension. The filtering being configured to define discrete pillar locations associated with the first mask.

In yet another embodiment, an apparatus for generating mask data suitable to produce a support pillar mask used in air dielectric interconnect structures is disclosed. The apparatus includes a mask data scanner configured to select features having an interconnect dimension from a first mask. The features having the interconnect dimension being defined to electrically interconnect devices distributed on a substrate. The apparatus further includes a mask data comparing engine for comparing mask data associated with an intermediate support pattern and mask data associated with the features having the interconnect dimension selected by the mask data scanner. The comparing being configured to identify a mask area where the intermediate support pattern and the features having the interconnect dimension overlap. Preferably, the identified mask area defines the location of a plurality of pillars.

In still another embodiment, computer readable media containing program instructions for automating support pillar layout for air dielectric interconnect structures is disclosed. The computer readable media includes program instructions for selecting features having an interconnect dimension from a first mask. The features having the interconnect dimension being configured to electrically interconnect devices distributed on a substrate. The computer readable media further includes program instructions for providing an intermediate support pattern that defines a predetermined spacing for a pillar mask layout. Program instructions for identifying overlap regions where the features having an interconnect dimension selected from the first mask overlap the intermediate support pattern. The overlap regions preferably define the pillar locations in the pillar mask layout.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which:

FIG. 5B shows a mask that remains after the operations of Equation 4 are performed by the mask generation software in accordance with one embodiment of the present invention.

FIGS. 6A through 6E illustrate the various stage operations performed by the mask generation software in generating a second level of pillars in accordance with one embodiment of the present invention.

DETAILED DESCRIPTION OF THE PREFERRED EMBODIMENTS

An invention for automating the mask layout of pillar structures used in air dielectric interconnect structures is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1A:
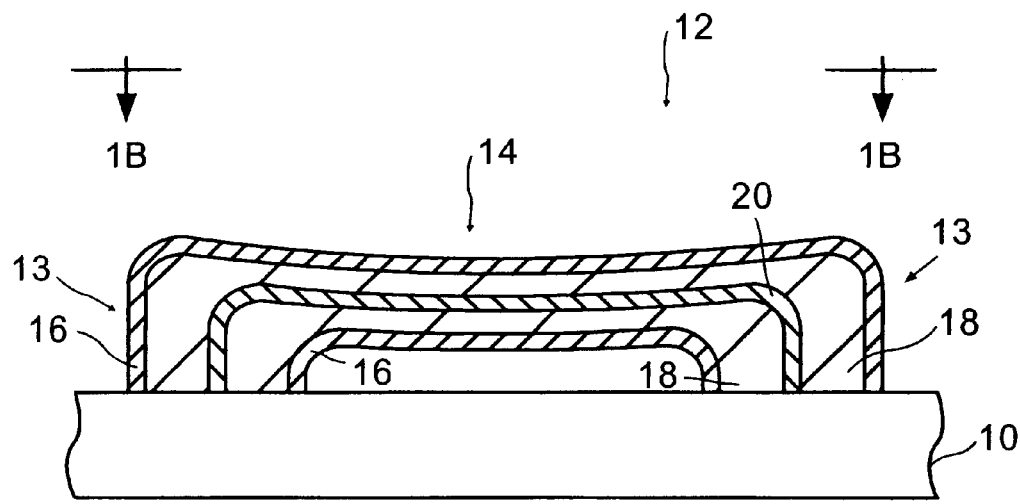
FIGS. 1A and 1B represent a cross-sectional view and a top view, respectively, of a prior art interconnect structure having a suspended portion over a silicon substrate.
Figure 1B:
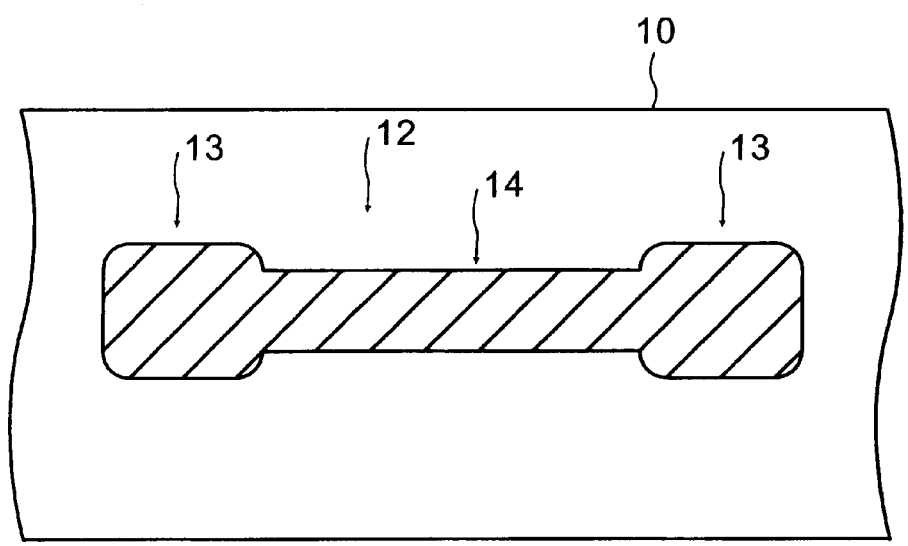
Figure 2A:
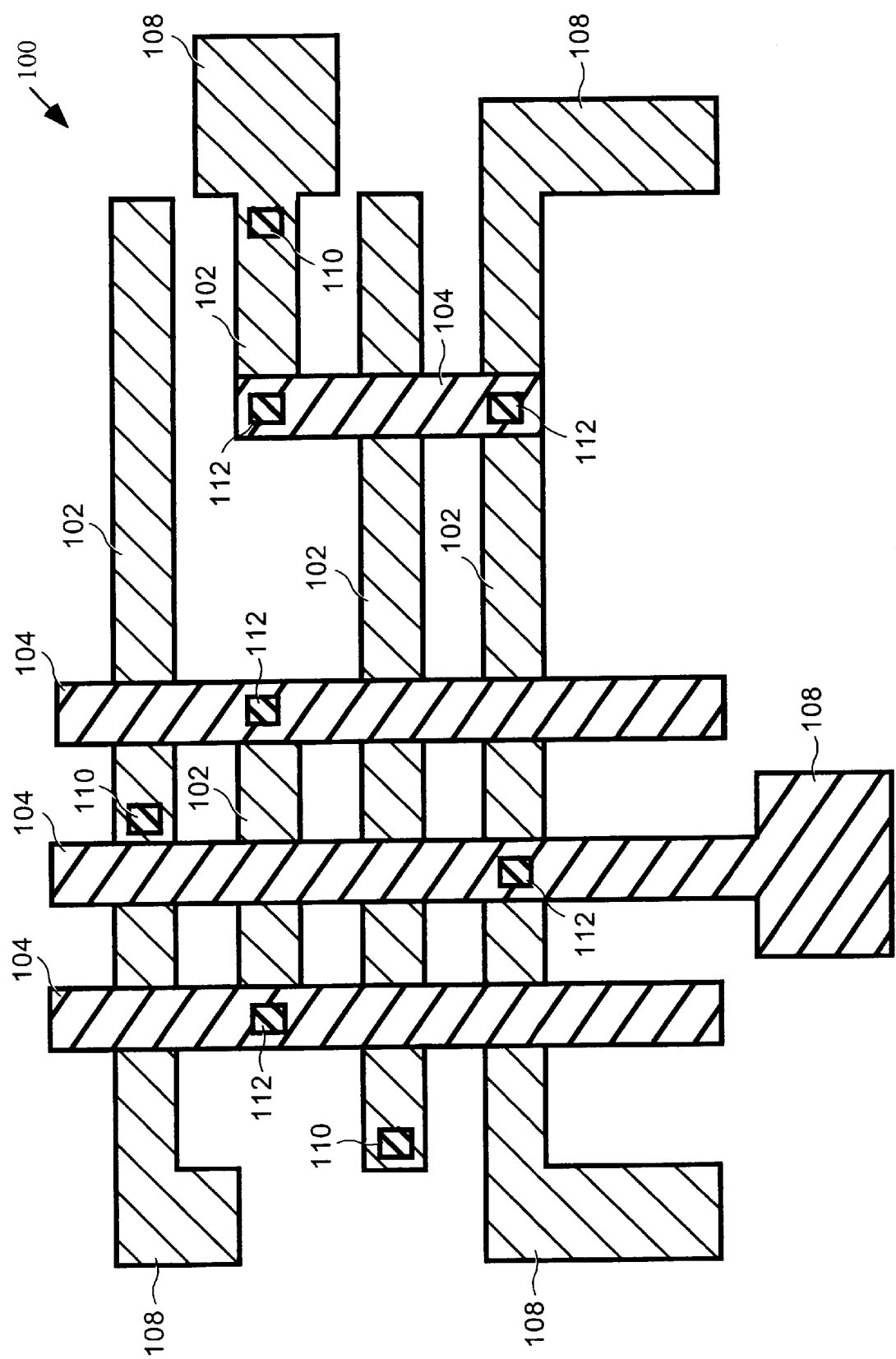
FIG. 2A shows an exemplary metallization interconnect layout in accordance with one embodiment of the present invention.

FIG. 2A shows an exemplary metallization interconnect layout in accordance with one embodiment of the present invention. In this example, a first air dielectric interconnect layer 102 preferably lies above a base metallization layer (not shown) that may be patterned over a semiconductor substrate. Therefore, first air dielectric interconnect layer 102 preferably represents a second metallization layer that may be used to interconnect transistors defined over the semiconductor substrate. In a preferred embodiment, the semiconductor substrate is preferably a gate array semiconductor substrate having a plurality of predefined base cells. Generally, each base cell preferably has pre-arranged doped regions that define the locations of transistor gates (e.g., polysilicon gates) that are formed over the surface of the gate array semiconductor substrate. Although specific reference is made to a gate array semiconductor substrate, it should be understood that the methods and apparatuses described herein are equally applicable to "cell based" technology and other suitable VLSI semiconductor substrates. In either case, other well known layers such as oxide materials may be interposed between the various layers. Typically, various transistor interconnections are completed using a patterned base metallization layer, however, many more interconnections are generally required to be completed using the air dielectric interconnect structures described herein.

A second air dielectric interconnect layer 104 is also shown defining various interconnections that may be made to the first air dielectric interconnect layer 102 and/or the base metallization layer. In general, the various interconnect layers are preferably constructed using sacrificial oxide that is subsequently removed using a suitable wet etching technique suitable to produce the air dielectric regions. For more information on the process of making the air dielectric interconnections, reference may be made to a co-pending U.S. patent application having U.S. Ser. No. 08/623,883 and entitled "Integrated Circuit Structure With Air Dielectric And Method For Making Same." This application has been incorporated by reference herein.

To support the various air dielectric structures in accordance with one embodiment of the present invention, support pillars are preferably defined throughout a layout design using an automated support pillar mask layout algorithm in accordance with one embodiment of the present invention. As described above, there is typically a need to support the first air dielectric interconnect layer 102 at various locations between the base metallization layer that is patterned over the semiconductor substrate, and between the first air dielectric interconnect layer 102 and the second air dielectric interconnect layer 104. As will be described below, the automated support pillar mask layout algorithm is preferably well suited to obviate the need to laboriously layout each of the support pillars in an ASIC device one at a time.

The exemplary layout of FIG. 2A also shows a power bus 108 that may be implemented to provide the devices formed on the semiconductor substrate with the necessary biasing voltages. Although not shown, other larger sized features may also be defined on various layers of the ASIC device to establish suitable input/output (I/O) drive circuits and the like. Further, a plurality of first vias 110 may be used to electrically interconnect first interconnect layer 102 to the base metallization layer that lies over the semiconductor substrate. In a like manner, a plurality of second vias 112 may be used to provide suitable electrical interconnection between first interconnect layer 102 and second interconnect layer 104.

Figure 2B:
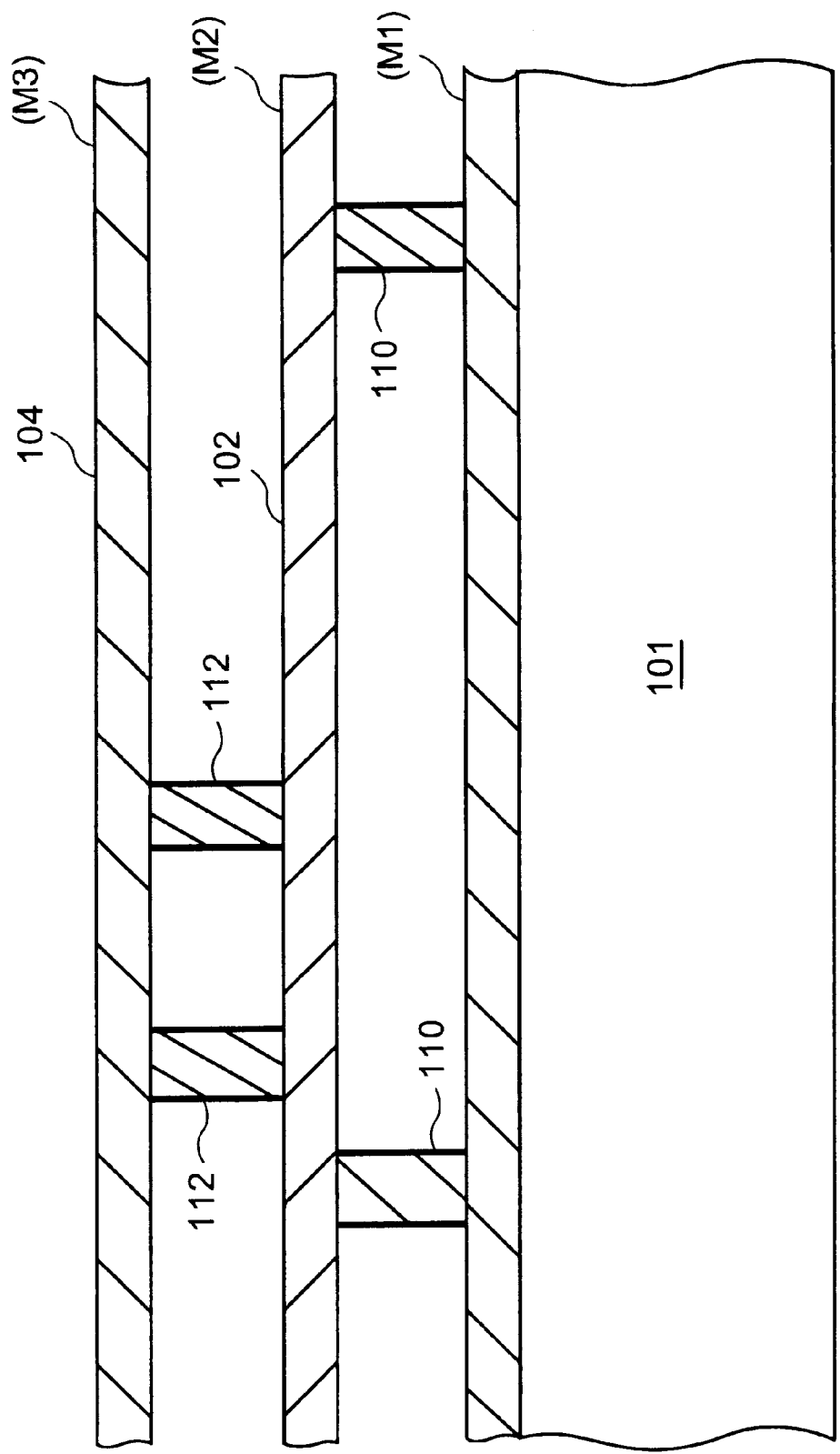
FIG. 2B is cross-sectional view of an exemplary substrate having three levels of metallization.

For ease of understanding, FIG. 2B provides a cross-sectional view of an exemplary substrate 101 having three levels of metallization. A base metallization level (M1) is preferably patterned and used to define electrical interconnections between transistors formed over substrate 101. Although the base metallization level (M1) completes some of the necessary electrical interconnections of a particular electrical circuit, additional interconnections formed on upper layers are typically used to avoid physically crossing over metallization lines formed with the base metallization level (M1). As such, to provide the necessary interconnection between the various transistors and power buses 108 (not shown), first vias 110 are provided to establish electrical interconnections between the base metallization level (M1) and a second metallization level (M2) that may be patterned to define the first air dielectric interconnect layer 102 lines shown in FIG. 2A.

In a like manner, second vias 112 are shown providing electrical interconnections between first air dielectric interconnect layer 102 and a third metallization level (M3) that may be patterned to form the second air dielectric interconnect layer 104 shown in FIG. A. For purposes of the following discussion, it will be assumed that the exemplary patterns exhibited by first air dielectric interconnect layer 102, second air dielectric interconnect layer 104, first vias 110 and second vias 112 represent "mask layouts" that may be used in the photolithography process that is commonly implemented to pattern the various metallization layers and etching via holes for forming electrically conductive vias.

Therefore, it will become apparent to those skilled in the art of designing mask layouts, automating the layout placement of support pillars throughout a particular integrated circuit design has the powerful potential of significantly reducing the layout manufacturing cycle. In some cases, the layout cycle may be reduced significantly depending on resources and the degree of error checking performed. This is especially true in the design of ASIC devices in which the millions of interconnect lines are automatically designed using well known "place and route" software layout tools. As described above, a common prior art method of designing the placement of support pillars is to study the millions of interconnect lines designed by the "place and route" software layout tools, and determine where support pillars will be needed. Advantageously, the automated layout placement of support pillars of the present invention obviates having to laboriously custom design each and every support pillar used throughout large scale ASIC design.

In one embodiment of the present invention, mask generation software may be used to assist in the automated layout placement of support pillars used in air dielectric interconnect structures. Generally, the mask generation software is provided with "coordinate data" related to the various mask layout layers to assist the mask generation software in determining the best locations for support pillars implemented throughout a semiconductor substrate. Based on the coordinate data associated with each of the mask layout layers, the mask generation software is instructed to single out all features having interconnect line widths. In this manner, the support pillars are preferably only automatically designed to support the air dielectric interconnect lines. Although any suitable mask generation software application may be custom programmed to assist in automatically identifying pillar locations, a preferred mask generation software application can be a CATS (Computer Aided Transcription System) available from Transcription Enterprises, Limited, located in Los Gatos, Calif.

Initially, the layout placement of support pillars is performed for the first air dielectric interconnect layer 102 with the assumption that there are no further interconnect layers above the first air dielectric interconnect layer 102. Once the layout placement of support pillars has been completed for first interconnect layer 102, if there are further interconnect layers lying above the first interconnect layer 102, a second layout placement of support pillars will be performed for the second air dielectric interconnect layer 104 using the same layout placement operations used in defining the layout placement of support pillars underlying first air dielectric interconnect layer 102.

If two levels of support pillars are defined, the determined layout placement mask for support pillars underlying the first air dielectric interconnection layer 102, and the layout placement mask for support pillars lying between the first air dielectric interconnection layer 102 and the second air dielectric interconnection layer 104 are compared. In one embodiment, the comparison is performed by taking the coordinate information of the mask for the first level of pillars and the second level of pillars and performing a logical "OR" to produce a new pillar mask for the first level of pillars. That is, the pillar mask for the first level will preferably be a mask having all pillars associated the first level of pillars as well as all pillars associated with the second level of pillars. Once the new pillar mask for the first level of pillars is defined, the second level of pillars will be implemented without modification.

As can be appreciated, when additional levels pillars are used to support additional levels of air dielectric interconnect layers, the same operations may be performed for each of the two topmost levels of pillars. By way of example, if three levels of pillars are need, a logical OR is performed between the third level of pillars and the second level of pillars to ascertain a new pillar mask for the second level. Of course, this assumes that the same logical OR operations were performed for all underlying successive pairs of layers.

Figure 3:
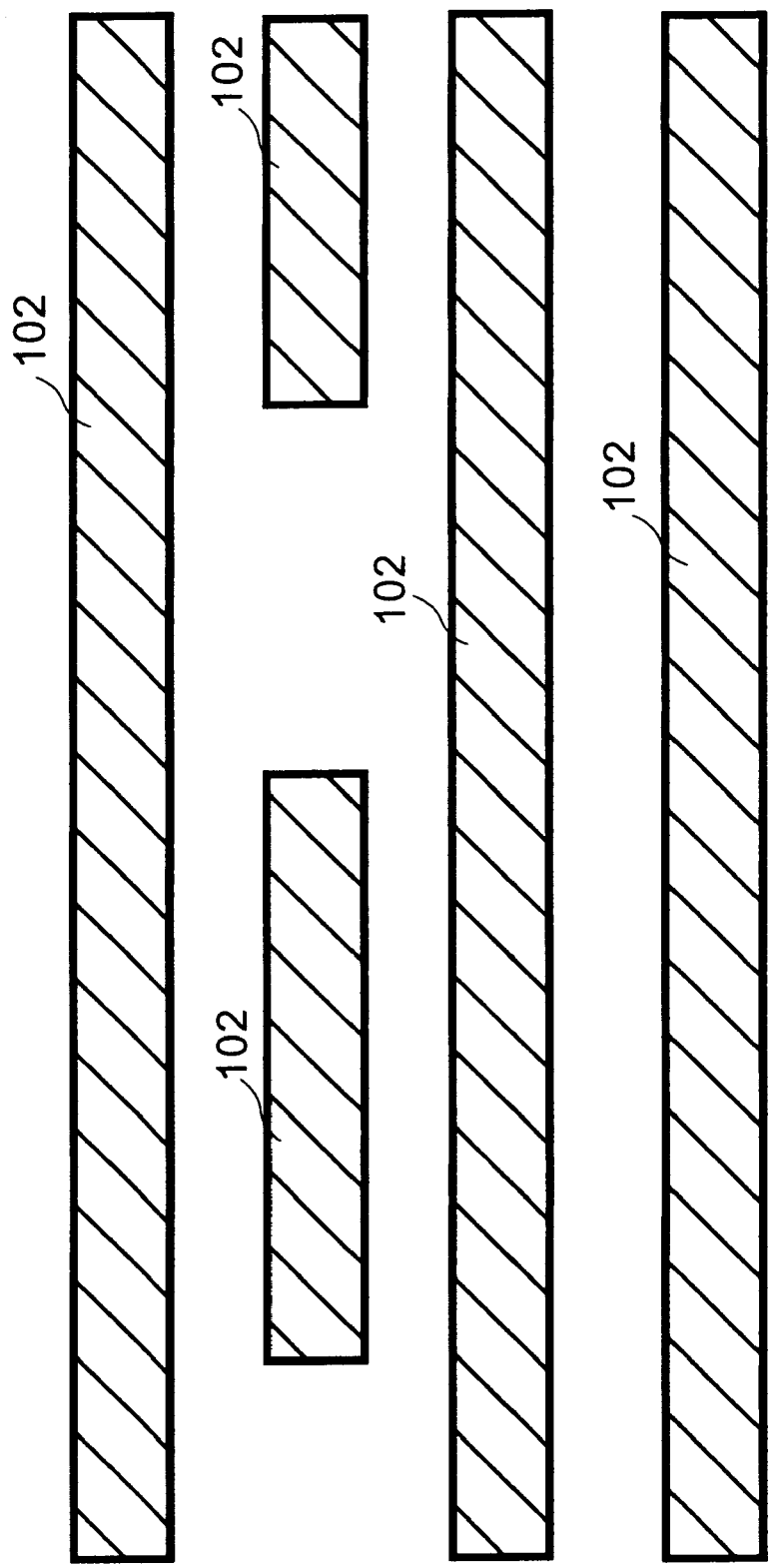
FIG. 3 is a mask layout defining a second level of metallization from which a first air dielectric interconnect layer is patterned in accordance with one embodiment of the present invention.

FIG. 3 is a mask layout defining the second level of metalization from which first air dielectric interconnect layer 102 is patterned. As shown, all features having widths greater than a minimum interconnect width are preferably eliminated at an initial determination to arrive at a mask layout illustrated in FIG. 3. In this manner, the layout placement of support pillars will only be provided to support air dielectric interconnect lines. Accordingly, to eliminate the various features having widths greater than a minimum interconnect width, the mask generation software will preferably perform a filtering operation identified in Equation 1 shown below.

$$\text{LCM2-1} = \text{CM2}@(-(\min \text{CM2})/2)@((\min \text{CM2})/2) \quad \text{(Equation 1)}$$

In Equation 1, LCM2-1 represents a Caltech Intermediate Format (CIF) used to define the coordinate information associated with all features (i.e., including features greater than a minimum interconnect width) defined on metallization layer-2 (M2). Once all features that are greater than the minimum interconnect width are eliminated, only features such as those defining first air dielectric interconnect layer 102 remain. To accomplish the filtering process, the mask generation software performs two logical operations identified in Equation 1. In the first logical operation, a "min CM2" dimension representing a minimum interconnect width is divided by two and subtracted from "CM2" which represents the original mask that contains all feature dimensions (e.g., including power bus 108) that includes first air dielectric interconnect layer 102.

Accordingly, each and every feature in mask CM2 is subtracted by min CM2/2 around its perimeter (i.e., min CM2/2 is subtracted from the x-dimensions and y-dimensions). At this point, the original mask CM2 is left with features that are greater than the minimum interconnect width (i.e., remaining features>min CM2). In the second logical operation, the same "min CM2" dimension is again divided by two, and is now added around the perimeter (i.e., added to the x-dimension and y-dimension) of all features that remained after the first logical operation of Equation 1. The remaining mask LCM2-1 produced by Equation 1 therefore contains features that are greater than the minimum interconnect width.

By way of example, if min CM2 is defined to be 0.6 microns, the 0.6 micron dimension is divided by 2 to produce 0.3 microns. The 0.3 microns are then subtracted from all feature dimensions defined on the original mask CM2 (i.e., metallization layer-2). That is, 0.3 microns is subtracted from x-dimension and y-dimension of each feature defined on the original CM2 mask. In this manner, any features defined in mask CM2 having a width of 0.6 microns is eliminated from the original mask CM2. Once these features are eliminated from the original mask CM2, they are no longer considered part of the original mask CM2.

In the second logical operation of Equation 1, min CM2 is again divided by 2 producing 0.3 microns, which is now added to the x-dimension and y-dimension of the features remaining after the first logical operation of Equation 1. As a result, Equation 1 produces a mask LCM2-1 that only has features greater than 0.6 microns. Of course, the 0.6 micron interconnect width is merely used as an example, and any suitable interconnect width may be implemented in the pillar layout technique described in accordance with one embodiment of the present invention.

In a next operation, the mask generation software will invert LCM2-1 as shown in Equation 2 below.

$$LCM2\text{-}2 = (-LCM2\text{-}1) \text{ AND } CM2 \quad \text{(Equation 2)}$$

As is well known in the art, inverting a mask layout means that areas identified for metallization features are now non-metallization regions, and the previous non-metallization regions that surrounded the metallization features are now features themselves. Once LCM2-1 has been inverted, a logical "AND" is performed with the original mask CM2 before it was modified in Equation 1. Once the mask generation software performs a logical AND with the inverted LCM2-1 and CM2, a new mask LCM2-2 is generated having features only with the exemplary interconnect widths of 0.6 microns. In one embodiment, the resulting mask LCM2-2 preferably defines the first air dielectric interconnect layer 102 is shown in FIG. 3. As can be appreciated, all features having widths greater than the minimum interconnect width have now been filtered out. Although only one power bus 108 (of FIG. 2A) is shown being filtered out, in large scale ASIC designs, the number of filtered features many be quite large.

Figure 4A:
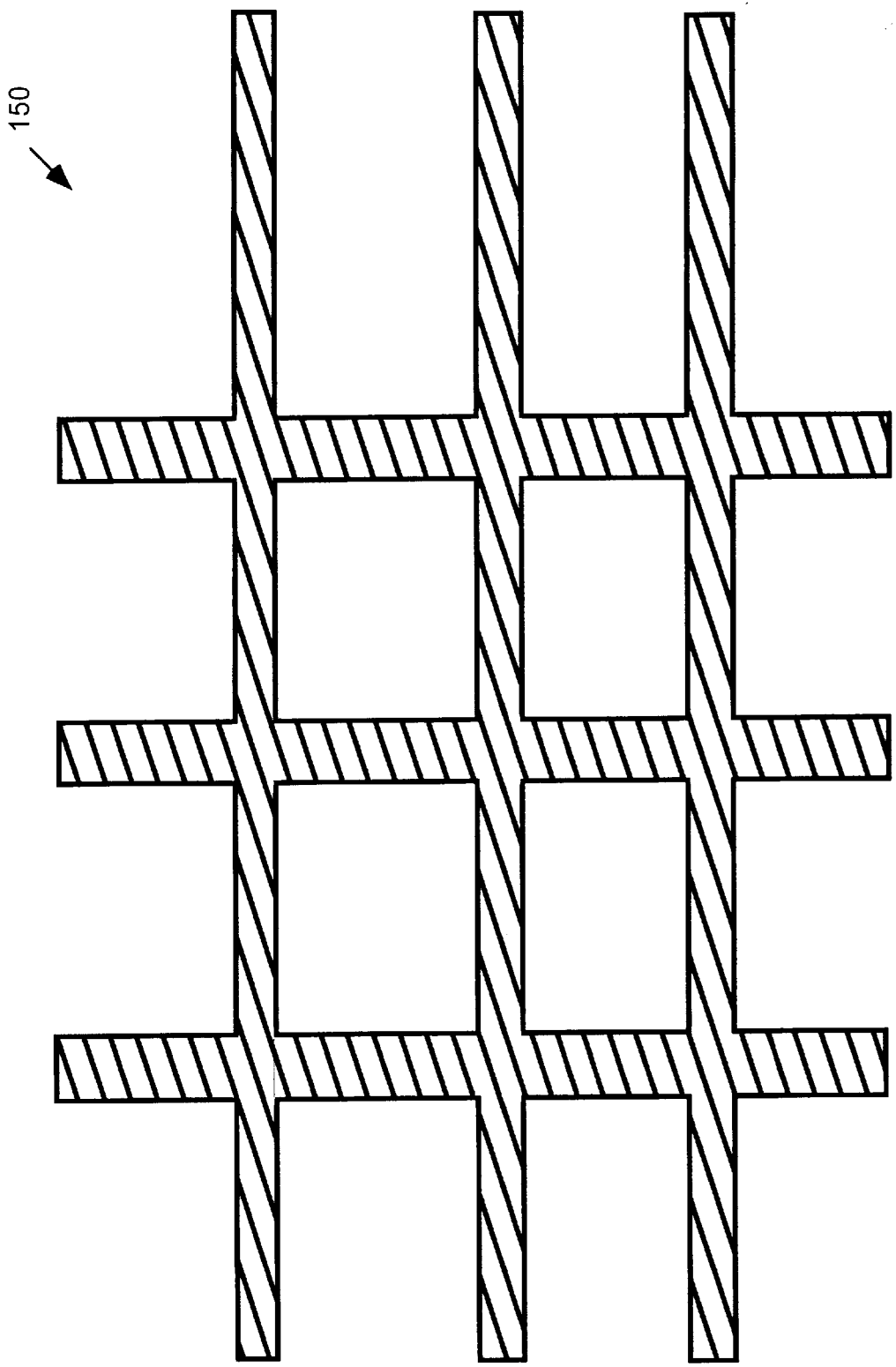
FIG. 4A shows an exemplary intermediate support pattern (ISP) that is preferably used to define a standard spacing between neighboring pillars in accordance with one embodiment of the present invention.

FIG. 4A shows an exemplary intermediate support pattern (ISP) that is preferably used to define a standard spacing between neighboring pillars in accordance with one embodiment of the present invention. In this embodiment, ISP 150 is shown as a grid pattern which may have a spacing of between about 2 microns and about 100 microns, and more preferably, between about 5 microns and about 15 microns, and most preferably, about 10 microns for 0.35 process technology. It should be understood that ISP 150 may have any suitable spacing depending on the number of pillars desired for a particular application specific integrated circuit (ASIC) and the process technology being implemented.

Figure 4B:
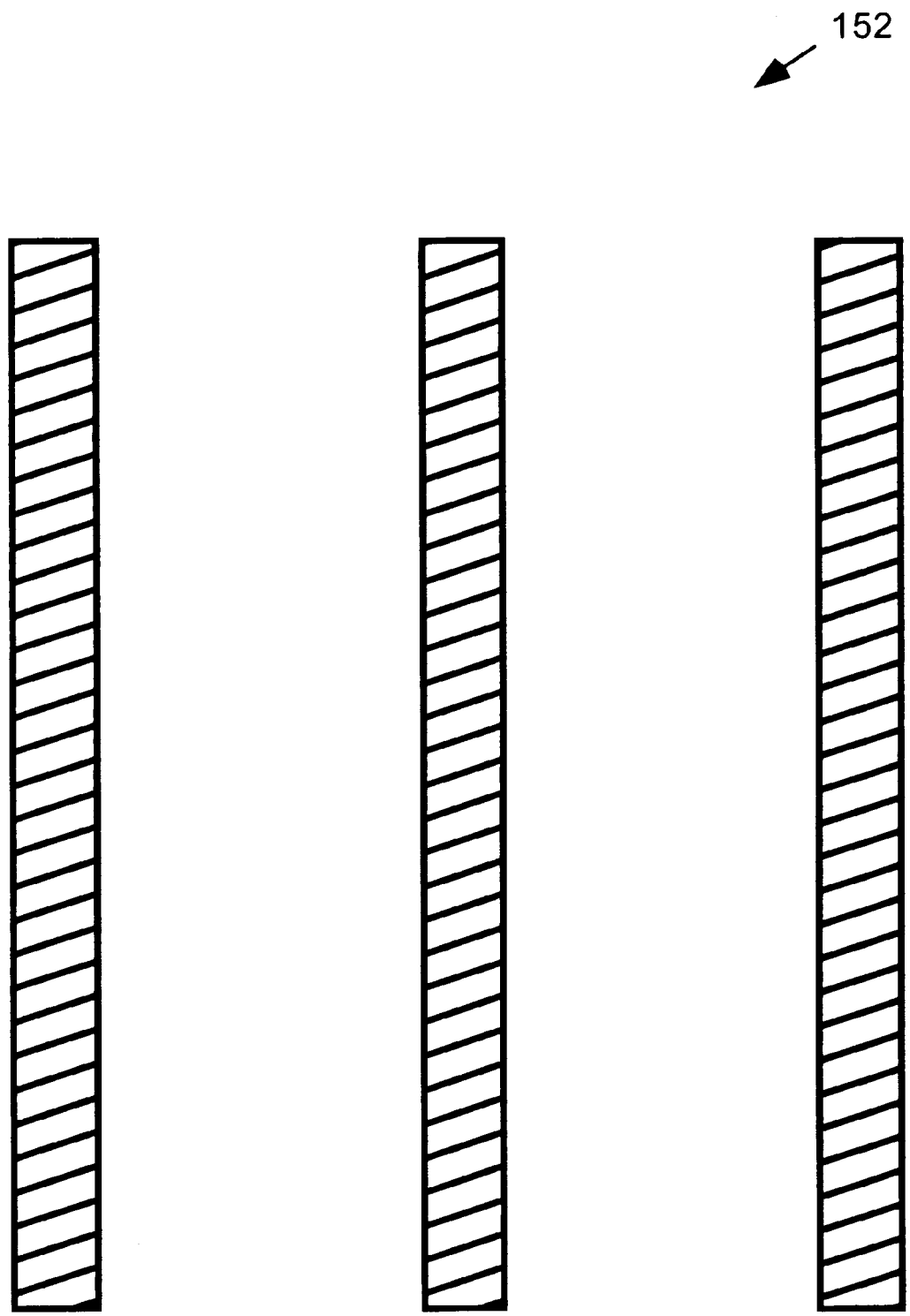
FIG. 4B shows an exemplary ISP pattern having a vertical intermediate support pattern in accordance with one embodiment of the present invention.

It is further noted that any suitable ISP geometry may be used depending on the arrangement of the interconnect lines for which pillars are being designed. By way of example, FIG. 4B illustrates an ISP pattern 152 having only vertical patterns (i.e., eliminating the horizontal patterns). In this embodiment, the vertical patterns are preferably well suited to identify an overlap area with horizontal interconnect lines. That is, if a designer knows in advance that all interconnect lines for a particular design are aligned along a certain axis (i.e., horizontal x-axis), an ISP pattern having patterns aligned perpendicular to that axis (i.e., vertical y-axis) may be used. Accordingly, the ISP patterns of FIGS. 4A and 4B should be considered exemplary ISP patterns for purposes of this discussion.

Figure 5A:
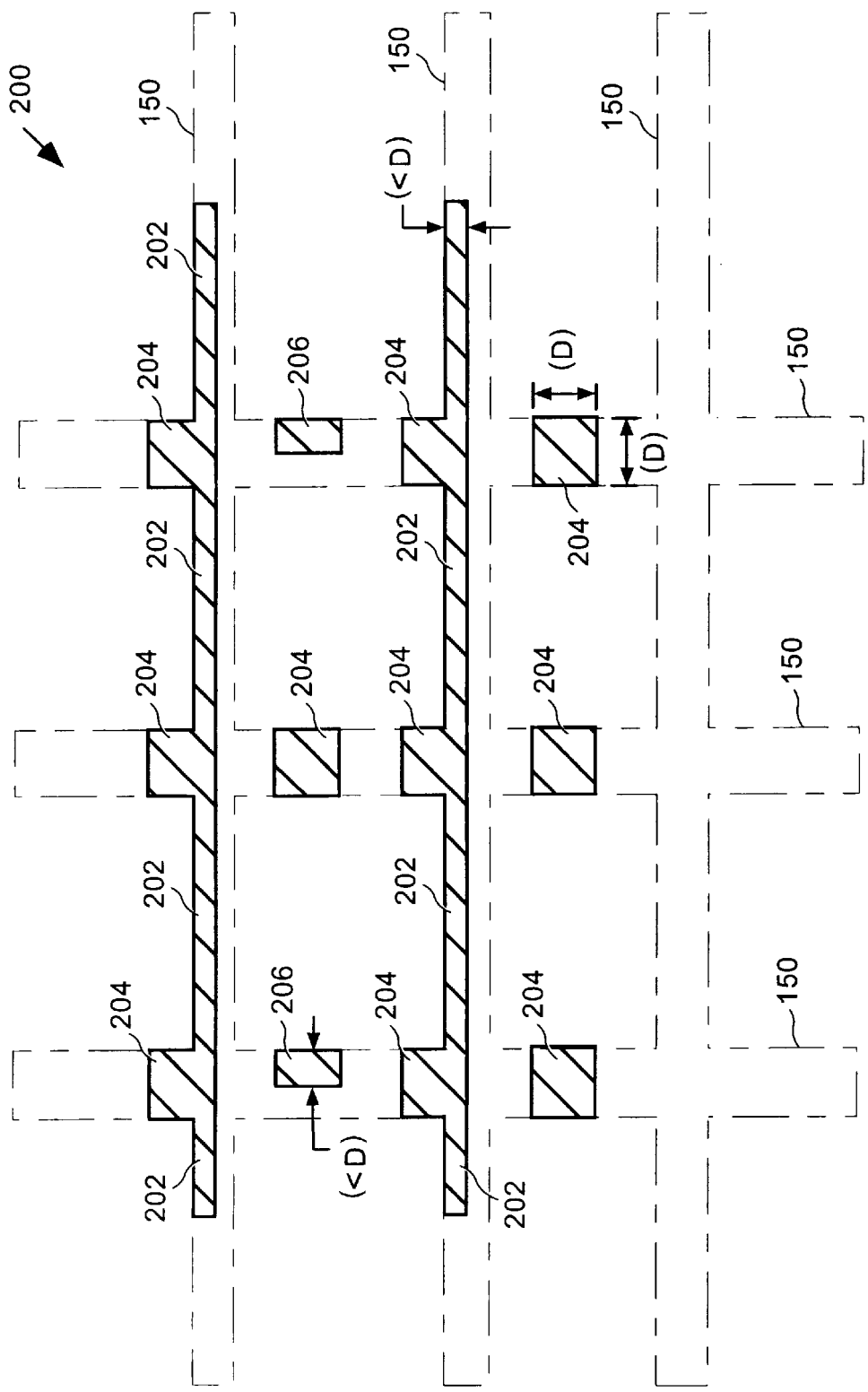
FIG. 5A shows a partial representation of an ISP pattern once it has been super imposed over the first air dielectric interconnect layer of FIG. 3 in accordance with one embodiment of the present invention.

FIG. 5A shows a hatched representation of ISP pattern 150 once it has been super imposed over first air dielectric interconnect layer 102 of FIG. 3. In this operation, the mask generation software preferably identifies regions of overlap where ISP pattern 150 overlaps first air dielectric interconnect layer 102, and eliminates regions of ISP pattern 150 where no overlap occurs. As such, the resulting hatched pattern has regions of thinner features 202 that overlapped a portion of the horizontal patterns of ISP pattern 150, and larger overlapped regions 204. The larger overlapped regions 204 preferably define areas where vertical component of ISP 150 overlapped over first air dielectric interconnect layer 102. Further shown are overlapped regions 206 that result from an overlap of shorter segments of first air dielectric interconnect layer 102 with the vertical ISP patterns 150.

To arrive at the overlapped hatched pattern shown in FIG. 5A, the mask generation software preferably performs the operations identified in Equation 3 shown below.

$$LCM2\text{-}3 = LCM2\text{-}2 \text{ AND } ISP \quad \text{(Equation 3)}$$

In Equation 3, the preliminary mask derived in Equation 2 (i.e., LCM2-2) is compared to the ISP pattern 150 of FIG. 4A through a logical "AND" operation. As a result of the this logical "AND" operation, a new mask pattern LCM2-3 is produced as described with reference to FIG. 5A. Of course, if ISP pattern 150 was replaced with ISP pattern 152 of FIG. 4B, the thinner overlapped portions 202 would not have been present in the new mask pattern LCM2-3 of FIG. 5A.

In a preferred embodiment, the width of the ISP pattern 150 is preferably the same width of the desired interconnect lines (e.g., 0.6 microns in the example provided above). Therefore, once the overlapped regions are identified through the use of Equation 3, some of the larger overlapped regions 204 will preferably have a width D as well as a height D which represent the desired mask locations for defining support pillars that will underlie and support first air dielectric interconnect layer 102. In some regions of the new mask pattern LCM2-3 of FIG. 5A, the larger overlapped regions 204 are integrally coupled to the thinner overlapped portions 202.

Although it is conceivable that the new mask pattern LCM2-3 may be used in its present form, it is preferred that the defined pillar locations be discrete regions to reduce the amount of oxide occupying the air dielectric structure. Accordingly, the mask generation software is preferably further used to identify features in FIG. 5A having a dimension that is less than D (i.e., <D). As shown, smaller features 206 have at least one dimension which is less than D, and the thinner overlapped portions 202 have at least one dimension that is less than D. Accordingly, the mask generation software will preferably identify those regions (i.e., that are less than D) and delete them from the new mask pattern LCM2-3 of FIG. 5A.

To filter out these smaller features, Equation 4 below shows that the new mask pattern LCM2-3 is operated on by the mask generation software to eliminate all features that are less than D. As described above, D is preferably the interconnect width that is used in a particular ASIC design.

$$LCM2\text{-}4 = LCM2\text{-}3 @ (-((\min CM2)/2) - (1 \text{ grid point})) \quad \text{(Equation 4)}$$
$$@ (((\min CM2)/2) - (1 \text{ grid point}))$$

Values for CM2 and grid point are selected based on the process technology being used and therefore defined in the software. In the example provided above, min CM2 was defined as 0.6 microns, and therefore, min CM2/2 is 0.3 microns. Once 0.3 microns has been established for min CM2/2, one grid point is subtracted from the 0.3 microns. In this example, if a minimum grid point is 0.02 microns, and min CM2/2 minus one grid point will therefore be 0.28 microns. That is, (min CM2)/2)–(1 grid point)=0.28 for this example.

As indicated by Equation 4 above, 0.28 microns is preferably subtracted from the x-dimension and y-dimension of each feature defined in the mask of LCM2-3. Once 0.28 microns have been subtracted from all features defined LCM2-3, any features that were 0.56 microns or less (e.g., 0.28+0.28) will be eliminated from mask LCM2-3 during this operation by the mask generation software. In other words, features that are less than D are eliminated from the mask design. The second operation defined in Equation 4 is an adding operation which essentially adds 0.28 microns (i.e., to the x-dimension and the y-dimension) to all features that remain in LCM2-3 after the first subtraction operation.

FIG. 5B shows a mask that remains after the operations of Equation 4 in accordance with one embodiment of the present invention. As described above, the mask shown in FIG. 5B identifies the preferred locations for support pillars in a particular integrated circuit that uses air as an interconnect dielectric. By way of example, the preferred locations are shown marked by a plurality of features 204. Although, the resulting mask of FIG. 5B may be used to define a final pillar layout mask, it is preferred that the plurality of features 204 be resized (RS) to compensate for any etch bias or any possible mnisalignments (i.e., RS essentially builds in an error tolerance) in the various masks used in fabricating an air dielectric interconnect structure.

Figure 5C:
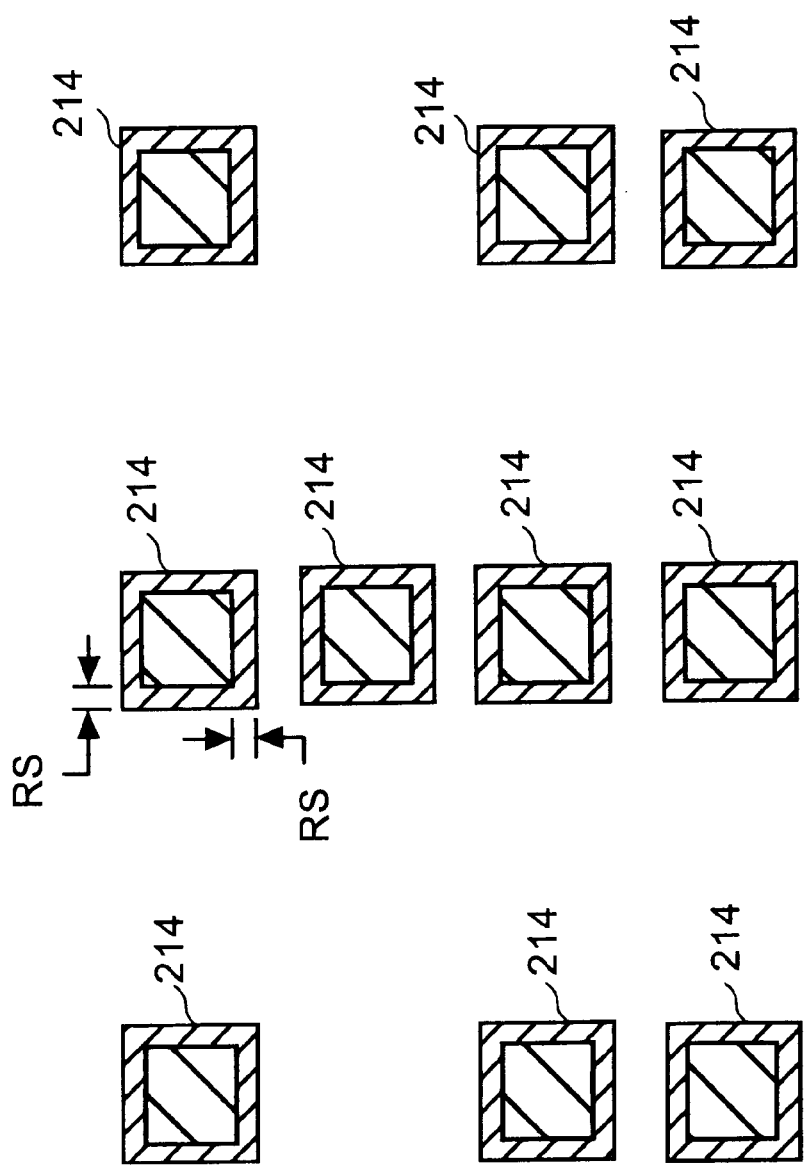
FIG. 5C illustrates a final preferred dimension for a pillar mask after a resizing (RS) is performed in accordance with one embodiment of the present invention.

FIG. 5C illustrates a preferred pillar mask 214 size after a resizing (RS) is performed on the plurality of features 204 of FIG. 5B in accordance with one embodiment of the present invention. In Equation 5 below, mask LCM2-4 is shown increased in size (i.e., a RS dimension is added to the x and y dimensions) to produce a pillar size that compensates for etch bias and misaligmnents. Therefore, the pillar mask for level 1 produced in Equation 5 defines the locations for the pillars that support the first air dielectric interconnect layer 102.

$$\text{LCM2-5=LCM2-4@(r2)=Pillar } 1_{LEVEL\ ONE} \quad \text{(Equation 5)}$$

Although FIG. 5C shows features 204 surrounded by an additional resize dimension RS to arrive at pillar mask 214, it should be understood that pillar locations 214 are actually located on a single mask, and the two types of hatching are merely used to pictorially illustrate the amount of resizing RS performed in accordance of one embodiment of the present invention.

Figure 5D:
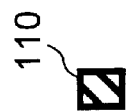
FIG. 5D shows the plurality of first vias of FIG. 2A in accordance with one embodiment of the present invention.
Figure 5D:
Figure 5D:
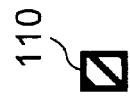

FIG. 5D shows first vias 110 shown in FIG. 2A in accordance with one embodiment of the present invention. In a preferred embodiment, support pillars are also preferably designed to surround each via in order to provide each of the first vias with a suitable encapsulating oxide material that advantageously ensures the integrity of the electrical interconnection established between the various metalization interconnect levels. Of course, if some designers wish to have the vias un-encapsulated, the un-encapsulated vias may work as well.

Accordingly, a mask (CC1) representing a mask containing vias 110 is compared through a logical "AND" with the mask of LCM2-2 of Equation 2 defined above.

$$\text{LCM2-6=LCM2-2 AND CC1} \quad \text{(Equation 6)}$$

By way of example, the mask generation software preferably takes LCM2-2 and performs a logical "AND" with CC1 to identify all first vias that overlap features having an interconnect width as shown in FIG. 3. Although only three vias are shown overlapped by the exemplary first air dielectric interconnect layer 102, it should be appreciated that other vias that do not overlap with the interconnect lines of FIG. 3 will not be identified by the operation performed in Equation 6.

Once the operations identified in Equation 6 are performed, all first vias 110 that overlap first air dielectric interconnect layer 102 are identified. Next, the mask generation software will preferably resize the identified vias to arrive at a suitable support structure dimension that is about the same as the support structure dimension illustrated in FIG. 5C above.

Figure 5E:
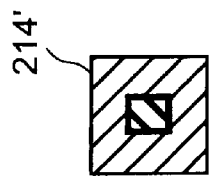
FIG. 5E shows the first vias after a resizing ($RS_y$) has been performed on x and y dimensions of each of the first vias in accordance with one embodiment of the present invention.
Figure 5E:
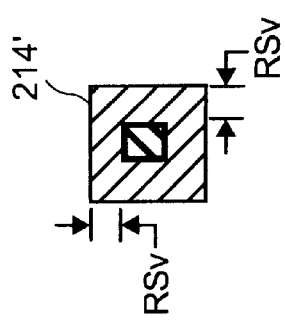
Figure 5E:
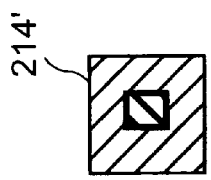

FIG. 5E shows first vias 110 after a suitable resize operation ($RS_v$) has been performed around the perimeter (i.e., the x and y dimensions) of each first via 110. As a result, a pillar mask 214' is produced for each of the first vias 110. As described above, first via 110 preferably lies between a base metallization layer that is patterned over a substrate and first air dielectric interconnect layer 102. As shown in Equation 7 below, LCM2-6 of Equation 6 is preferably resized by the mask generation software to produce the pillar mask 214' shown in FIG. 5E.

$$\text{LCM2-7=LCM2-6@(r3)=Pillar Via 1} \quad \text{(Equation 7)}$$

As shown above, the resizing dimension "r3" is preferably applied to all dimensions identified in FIG. 5D. The resulting pillar mask 214' is identified as Pillar Via 1. Once Pillar Via 1 has been produced through the use of Equation 7, a total Pillar 1 for level one is generated as shown in Equation 8 below.

$$\text{Total Pillar } 1_{LEVEL\ ONE} = \text{Pillar } 1_{LEVEL\ ONE} + \text{Pillar Via 1} \quad \text{(Equation 8)}$$

Figure 5F:
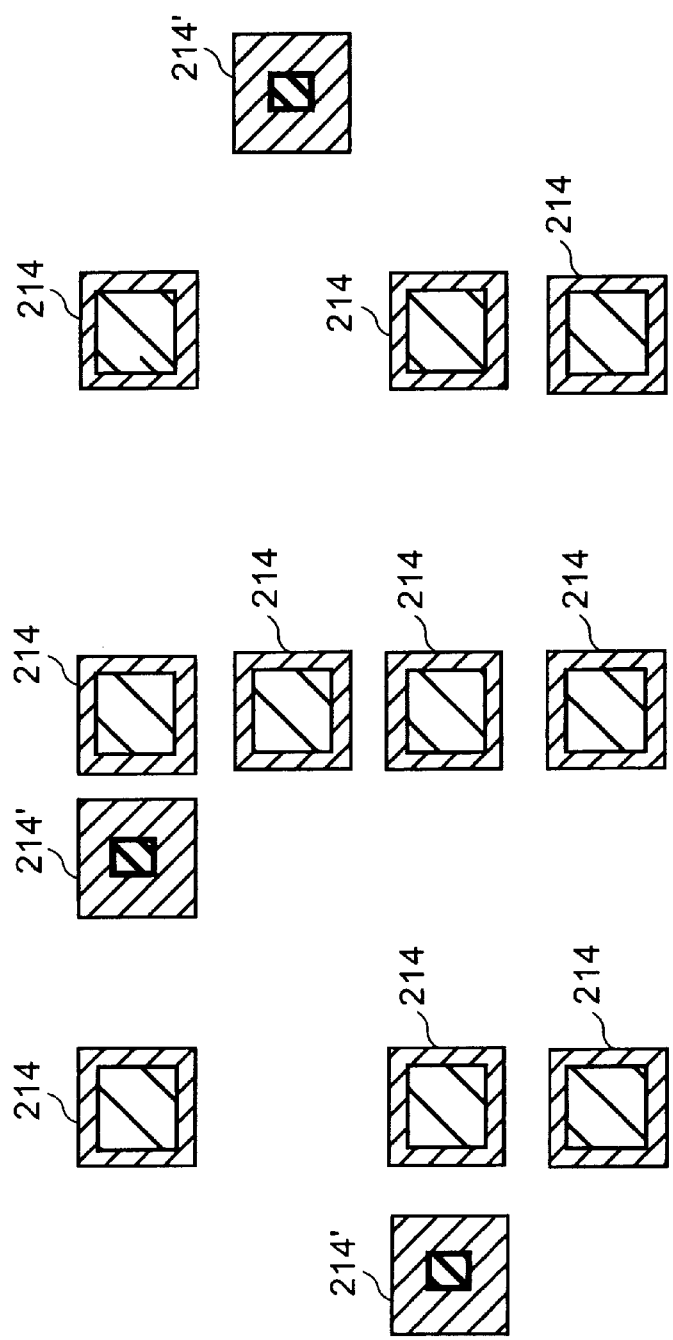
FIG. 5F shows a final pillar mask for a first level of pillars in accordance with one embodiment of the present invention.

The result of Equation 8 is shown in FIG. 5F which includes both "Pillar $1_{LEVEL\ ONE}$" and "Pillar Via 1." As described above, the pillar mask used to support the first air dielectric interconnect layer 102 is automatically generated by the mask generation software. It should be understood that the pillar masks 214 and 214' actually lie on one mask level, and are only illustrated using different hatching to pictorially illustrate the progressive steps taken in generating Total Pillar $1_{LEVEL\ ONE}$.

In this embodiment, the generation of Total Pillar $1_{LEVEL\ ONE}$ required that the mask generation software implement the equations described in Equations 1 through 8. However, if multi-level air dielectric interconnect structures are designed, the mask generation software will be required to perform all of the above identified operations for the second level of pillars that will lie between the first air dielectric interconnect layer 102 and the second air dielectric interconnect layer 104 shown in FIG. 2B. Once the second level of pillars is determined, the first level of pillars is modified to include all of the pillars identified for the first level of pillars as well as the second level of pillars. To pictorially illustrate this process, FIGS. 6A through 6E will be used to show the generation of the second level of pillars (e.g., generation of masks LCM3-1 through LCM3-7), and FIG. 7 illustrates the modified first level of pillars when two levels of pillars are generated.

FIG. 6A shows a hatched representation of ISP pattern 150 once it has been super imposed over second air dielectric interconnect layer 104 of FIG. 2A. In this operation, the mask generation software preferably identifies regions of overlap where ISP pattern 150 overlaps second air dielectric interconnect layer 104, and eliminates regions of ISP pattern 150 where no overlap occurs. As such, the resulting hatched pattern has regions of thinner features 302 that overlapped a portion of the vertical patterns of ISP pattern 150, and larger overlapped regions 304. The larger overlapped regions 304 preferably define areas where the horizontal component of ISP 150 overlaps second air dielectric interconnect layer 104.

As in the operations performed to generate the first level of pillars, a preliminary mask LCM3-3 representing the features of FIG. 6A is produced. In general, LCM3-3 is generated by comparing the ISP pattern 150 of FIG. 4A through a logical "AND" operation. Also shown are features having dimensions that are less than D. As described in the examples above, D represents a preferred interconnection width. In a next operation, dimensions that are less than D are preferably filtered out as described above with respect to Equation 4.

Figure 6B:
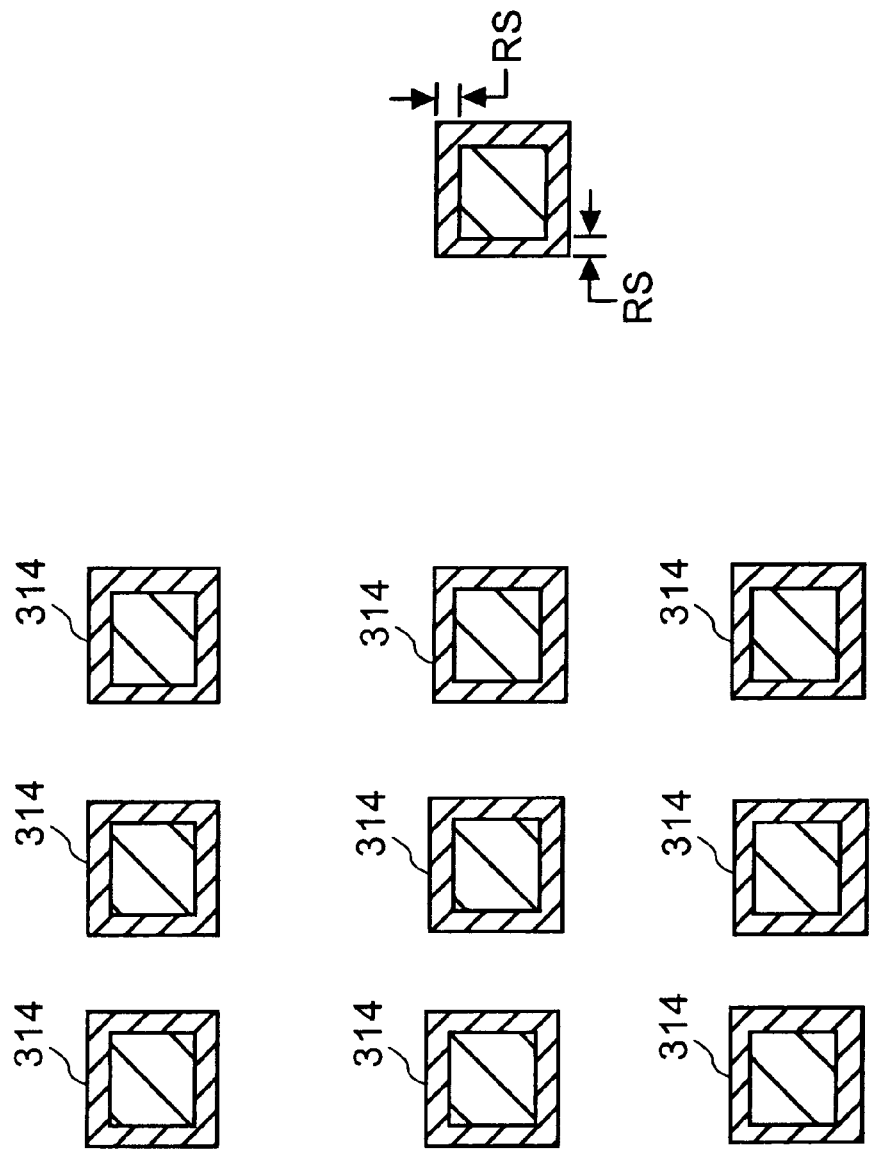
Figure 6D:
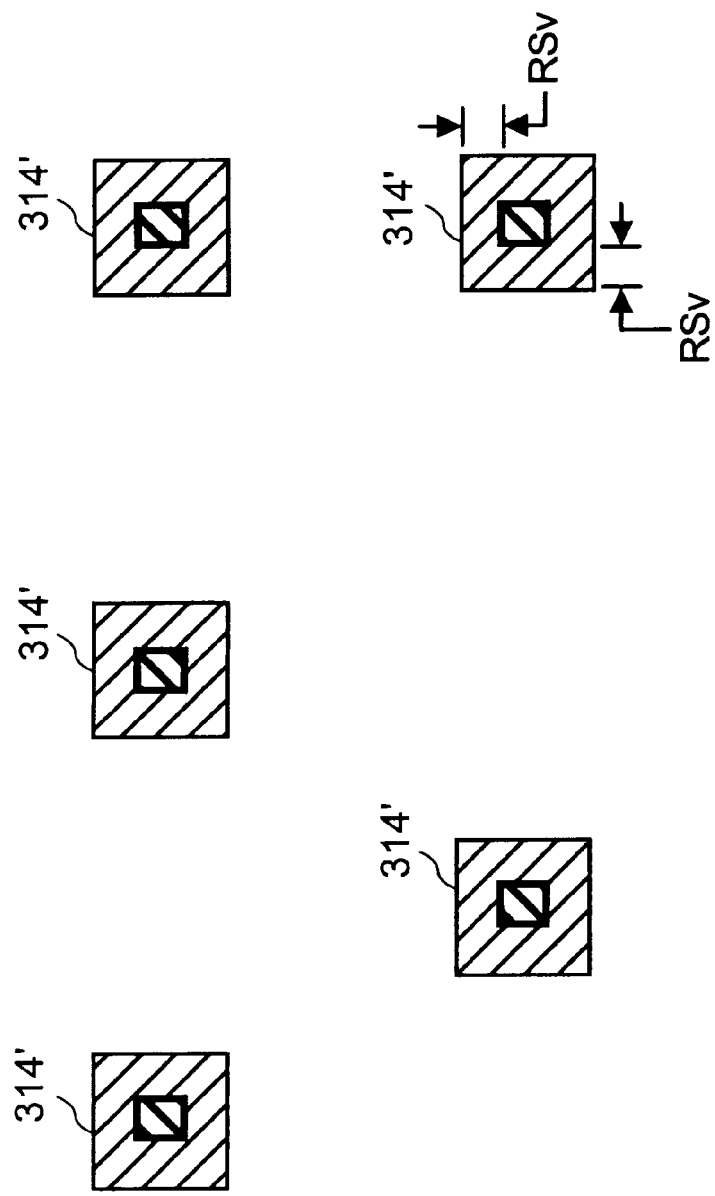
Figure 7:
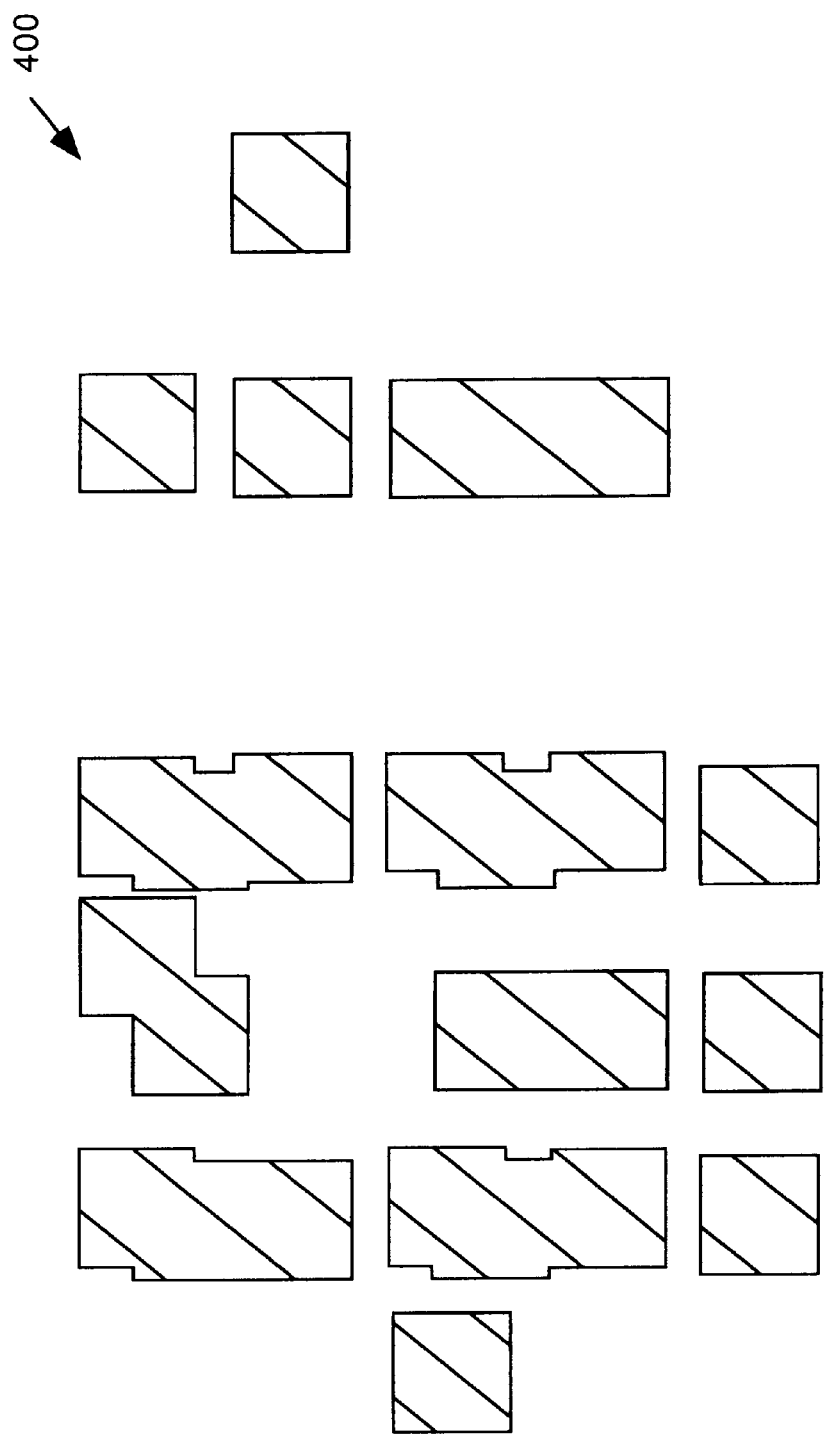
FIG. 7 shows a modified pillar mask for the first level of pillars when a second level of pillars are generated in accordance with one embodiment of the present invention.

FIG. 6B shows a pillar mask 314 after a resize operation is performed in accordance with one embodiment of the present invention. By way of example, the pillar mask 314 may be generated by the mask generation software through the operations (i.e., analogous to Equation 5) defined in Equation 9 below for the second level of pillars.

$$\text{LCM3-5=LCM3-4@(r2)=Pillar } 2_{LEVEL\ TWO} \quad \text{(Equation 9)}$$

FIG. 6C shows second vias 112 of FIG. 2A in accordance with one embodiment of the present invention. In a preferred embodiment, support pillars are also preferably designed to surround each via in order to provide each of the second vias with a suitable encapsulating oxide layer that advantageously ensures the integrity of the electrical interconnection established between the various metallization interconnect levels. Of course, if some designers wish to have the vias un-encapsulated, the un-encapsulated vias may work as well. As in Equation 7 above, each of the second vias are also preferably resized ($RS_v$) to produce a pillar mask 314' illustrated in FIG. 6D. In this embodiment, this via mask is preferably identified as Pillar Via 2 as shown in Equation 10 below.

$$\text{LCM3-7=LCM3-6@(r3)=Pillar Via 2} \quad \text{(Equation 10)}$$

Figure 6E:
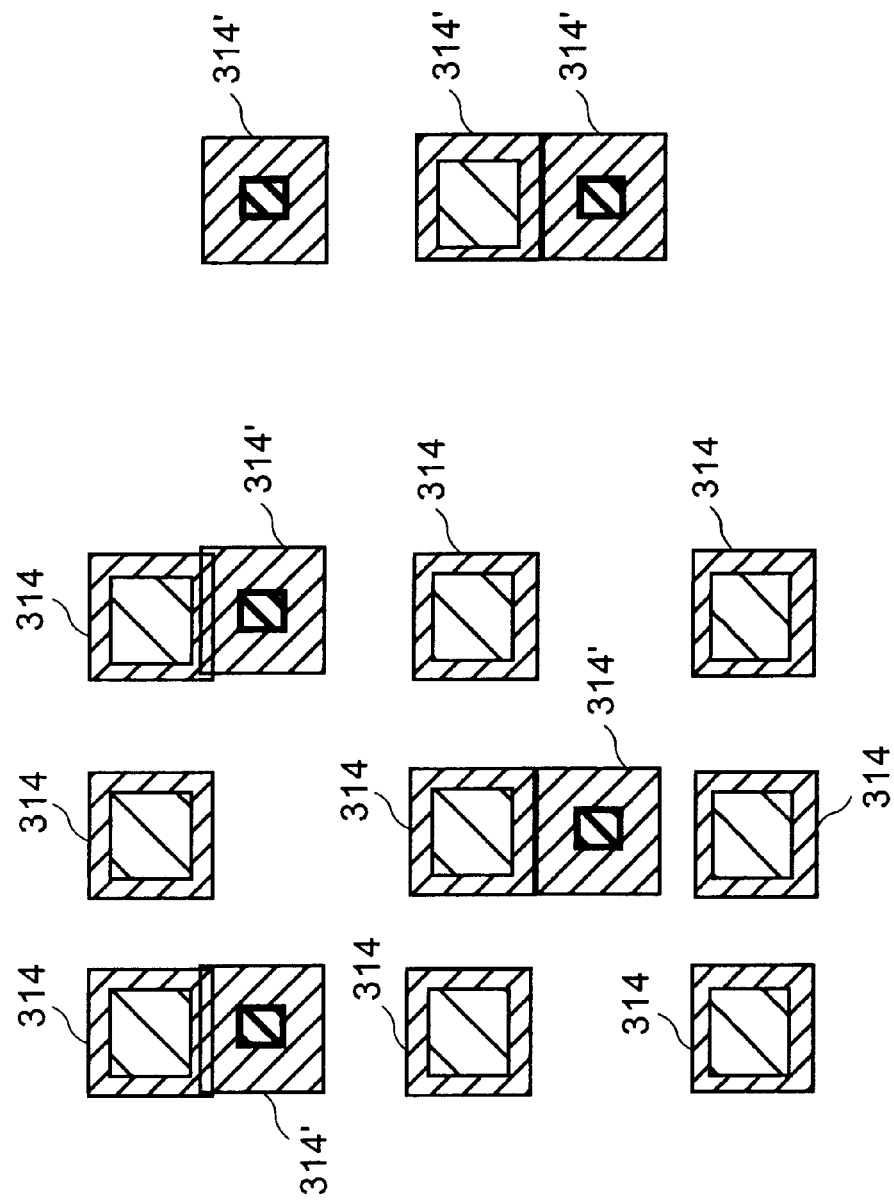

FIG. 6E illustrates the combination of the pillar mask defined by Pillar $2_{LEVEL\ TWO}$ in Equation 9 and Pillar Via 2 in Equation 10 in accordance with one embodiment of the present invention. At this point, the Total Pillar $2_{LEVEL\ TWO}$ mask has been generated by the mask generation software that includes pillar masks 314 and 314' which are described with reference to Equation 11 below.

$$\text{Total Pillar } 2_{LEVEL\ TWO} = +LCM3\text{-}5(\text{Pillar } 2_{LEVEL\ TWO}) + \quad \text{(Equation 11)}$$
$$LCM3\text{-}7(\text{Pillar Via 2})$$

As shown in Equation 11, the mask generation software has now generated the mask layout for the second level of pillars that lies between the first air dielectric interconnect layer 102 and the second air dielectric interconnect layer 104. In this example, two levels of air dielectric interconnect layers have been described for ease of illustration, however, it should be understood that additional levels of air dielectric interconnect layers may be formed depending on the demands of a particular integrated circuit design.

FIG. 7 shows a modified pillar mask 400 for the first level of pillars in accordance with one embodiment of the present invention. Because two levels of pillars are being designed in this example, the mask generation software will preferably combine (i.e., by performing a logical "OR") the mask layouts for Total Pillar $1_{LEVEL\ ONE}$ of Equation 8 and Total Pillar $2_{LEVEL\ TWO}$ of Equation 11 to produce a modified pillar mask 400 that includes all of the pillar masks 214, 214', 314, and 314'. As shown, some of the pillar masks that result as part of the modified pillar mask 400 are overlapping portions of each other producing mask features of various designs. In general, it is important to realize that the step of combining the masks of Equations 8 and 11 preferably ensure that the second level of pillars is structurally supported by a pillar structure defined along with the first level of pillars. As shown in Equation 12 below, the first level of pillars (i.e., Pillar 1) for a structure having "two levels" of pillars will preferably have the modified pillar mask 400 shown in FIG. 7.

$$\text{Pillar } 1_{TWO\ LEVELS} = LCM2\text{-}5(\text{Pillar } 1_{LEVEL\ ONE}) + \quad \text{(Equation 12)}$$
$$LCM2\text{-}7(\text{Pillar Via 1}) +$$
$$LCM3\text{-}5(\text{Pillar } 2_{LEVEL\ TWO}) +$$
$$LCM3\text{-}7(\text{Pillar Via 2})$$

It should be understood that although only two levels of pillars have been described, if additional pillars are desired, the same operations may be performed by the mask generation software for each of the additional levels of pillars that may be desired.

Figure 8A:
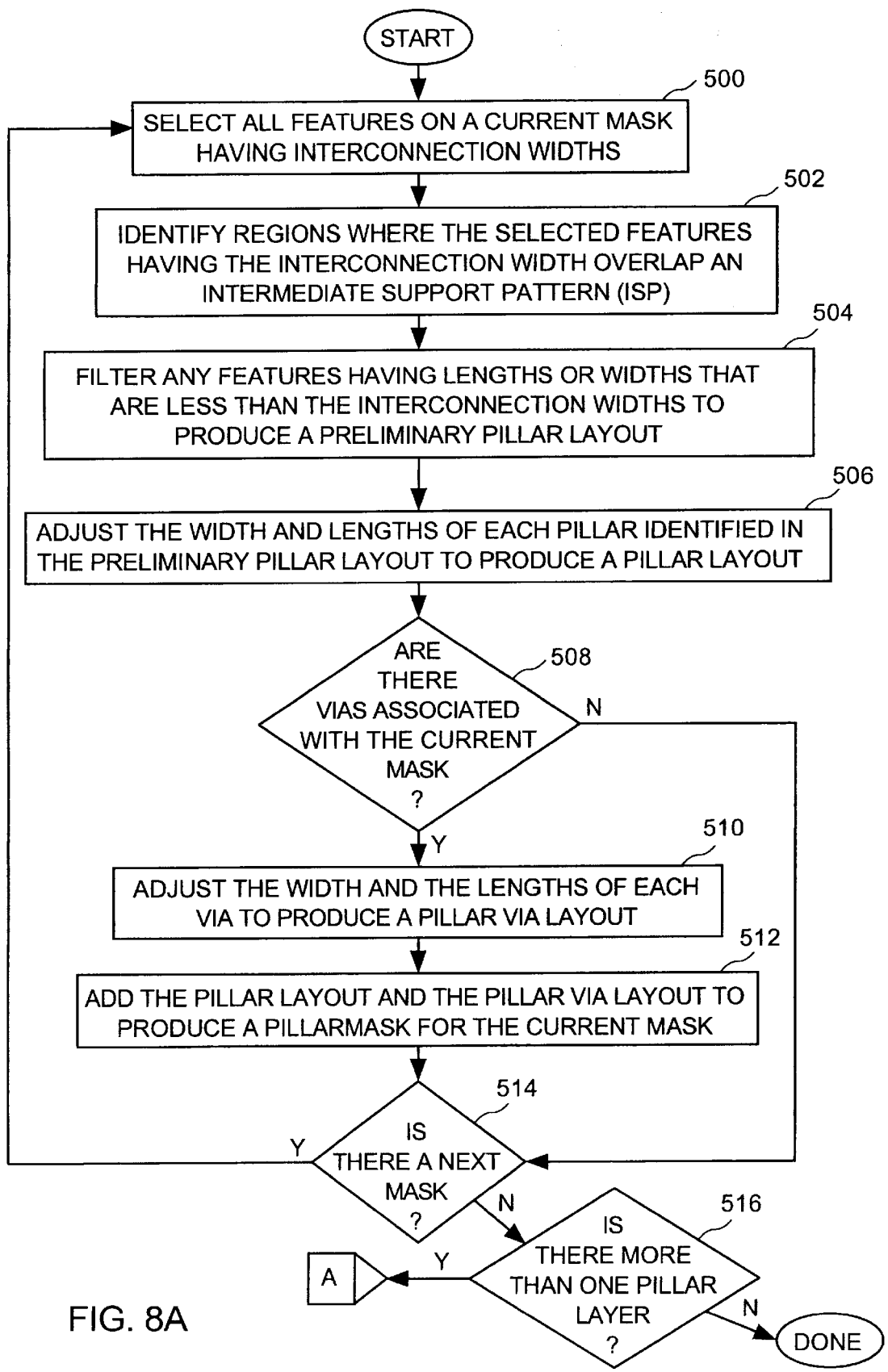
FIGS. 8A and 8B are flowchart diagrams illustrating the preferred method operations performed in automatically generating pillar masks for air dielectric interconnect structures in accordance with one embodiment of the present invention.

FIG. 8A is a flowchart diagram of the preferred method operations performed in automatically generating pillar masks for air dielectric interconnect structures in accordance with one embodiment of the present invention. In operation 500, the mask generation software preferably selects all features on a current mask having interconnect widths. By way of example, a current mask may have features that are larger than the interconnect widths that are typically used for supplying power to various locations of integrated circuit (i.e., ASIC power buses), or data bus routing. Once the features having the interconnect widths are selected in operation 500, the method proceeds to an operation 502 where the mask generation software identifies regions where the selected features having the interconnect widths overlap an intermediate support pattern (ISP).

As shown in FIGS. 4A and 4B above, the intermediate support pattern is preferably used to establish a predefined spacing for the support pillar masks being generated by the mask generation software. As described above, areas that overlap the identified interconnect features with the intermediate support pattern (ISP) are identified as preliminary pillar mask features. The method now proceeds to an operation 504 where the mask generation software filters any features having lengths or widths (i.e., dimensions in the x-coordinate and the y-coordinate) that are less than the interconnect width defined for the integrated circuit. In this step, once the filtering process is complete, a preliminary pillar layout mask is produced which identifies the preferred locations of the pillar mask used in a particular air dielectric interconnect structure.

The method then proceeds to a step 506 where the width and length of each of the pillars defined in the preliminary pillar layout are adjusted to produce an actual pillar mask size suitable to compensate for over-etching and misalignments. As described above, the adjustment is preferably a resizing of all dimensions that may include x-coordinate dimensions and y-coordinate dimensions of the features produced in operation 504. Once the dimensions have been adjusted in step 506, the method proceeds to a decision operation 508 where it is determined whether there are vias associated with the current mask. If there are no vias associated with the current mask, the method will proceed to a decision operation 514.

On the other hand, if vias are defined between the first air dielectric interconnect layer and a substrate underlying the first air dielectric interconnect layer, those vias are identified and the method proceeds to an operation 510. In operation 510, the widths and lengths (i.e., the x-coordinate dimensions and the y-coordinate dimensions) of each of the identified vias are adjusted to produce a pillar via layout. In other words, pillars will be defined where vias will ultimately be formed to ensure that the vias are protected with a suitable amount of silicon dioxide material (i.e., the pillars are preferably made of a silicon dioxide material). Once the pillar via layout has been completed in operation 510, the method proceeds to an operation 512 where the pillar layout produced in operation 506 and the pillar via layout produced in operation 510, are added to produce a pillar mask that is associated with the current mask.

As described above, the pillars defined in the pillar mask will preferably be spaced apart based on the intermediate support pattern separation discussed in operation 502. However, the spacing associated with pillars defined in the pillars via layout will preferably be arbitrary spaced apart depending the electrical interconnections needs in a particular integrated circuit.

The method then proceeds to a decision step 514 where it is determined if there is a next mask associated with the present integrated circuit. By way of example, the next mask may include the interconnection layout for a second level of air dielectric interconnect structures. If there is another mask, the method will proceed through operations 500 to operation 506 as described above. Again, a determination will be made in operation 508 to ascertain if there are any vias interconnecting a second air dielectric interconnect layer, and a first air dielectric interconnect layer (e.g., interconnect layers 102 and 104 described with reference to FIG. 2B). If there are, the method will again proceed through operations 510 and 512.

On the other hand, if there are no vias located between the first air dielectric interconnect layer and the second air dielectric interconnect layer, then the method will proceed back to decision operation 514. If there are no more layers, the method will proceed to a decision operation 516 where it is determined if there is more than one pillar layer. If there is more than one pillar, the method will proceed to "A."

Figure 8B:
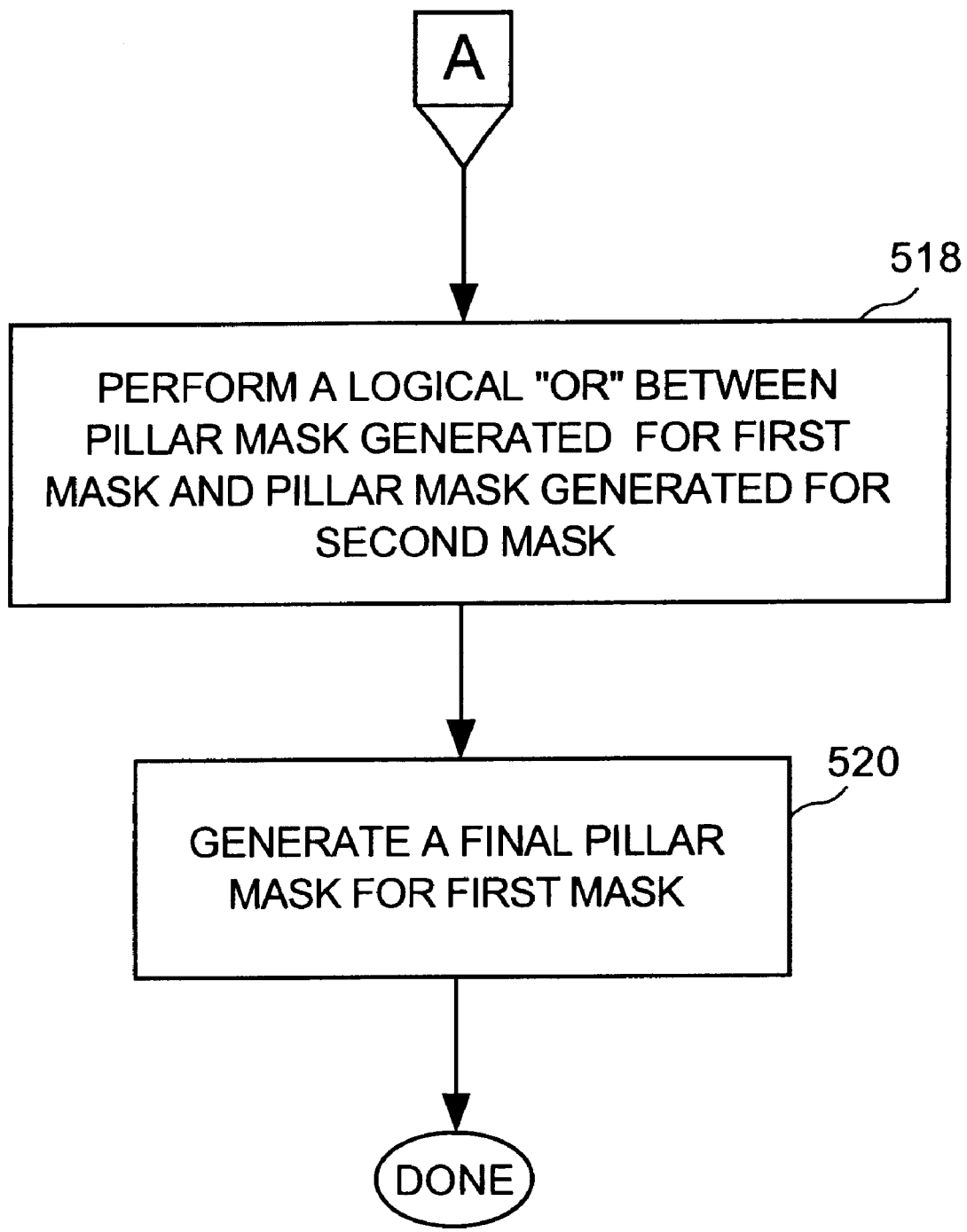

FIG. 8B shows the continuation of the flowchart operations described in FIG. 8A in accordance with one embodiment of the present invention. The method continues in operation 518 where a logical "OR" is performed between the coordinate data associated with the pillar mask generated for a first pillar mask and the coordinate data associated with the pillar mask generated for the second pillar mask. The method then proceeds to an operation 520 where a final pillar mask for the first level of pillars is generated. In this example, the final pillar mask is described in greater detail with reference to Equation 12 above.

In general, the final pillar mask will preferably include the pillars and via pillars for the first pillar mask and the pillars and via pillars for the second pillar mask. Once the final pillar mask has been generated, the method will be done. Referring back to decision operation 516, if there was only one air dielectric interconnect structure associated with a particular integrated circuit, the method would not require the second pillar mask. As such, the preferred method operations may be performed for any number of air dielectric interconnect levels, and in any semiconductor integrated circuit structure that may benefit from precision software layout tools.

The invention may also employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations. An exemplary structure for the invention is described below.

Figure 9:
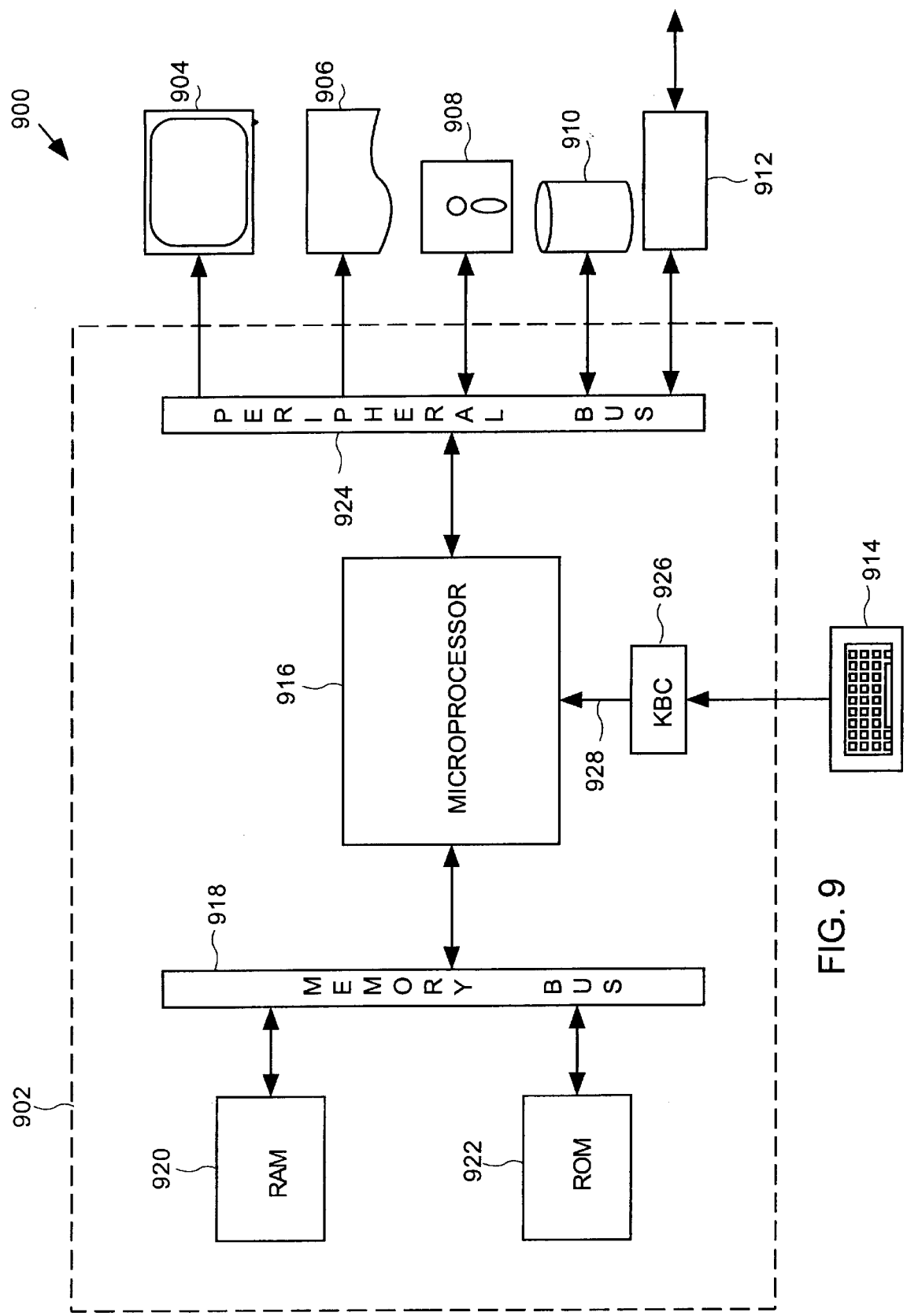
FIG. 9 is a block diagram of an exemplary computer system for carrying out the processing in accordance with one embodiment of the present invention.

FIG. 9 is a block diagram of an exemplary computer system 900 for carrying out the processing according to the invention. The computer system 900 includes a digital computer 902, a display screen (or monitor) 904, a printer 906, a floppy disk drive 908, a hard disk drive 910, a network interface 912, and a keyboard 914. The digital computer 902 includes a microprocessor 916, a memory bus 918, random access memory (RAM) 920, read only memory (ROM) 922, a peripheral bus 924, and a keyboard controller 926. The digital computer 900 can be a personal computer (such as an IBM compatible personal computer, a Macintosh computer or Macintosh compatible computer), a workstation computer (such as a Sun Microsystems or Hewlett-Packard workstation), or some other type of computer.

The microprocessor 916 is a general purpose digital processor which controls the operation of the computer system 900. The microprocessor 916 can be a single-chip processor or can be implemented with multiple components. Using instructions retrieved from memory, the microprocessor 916 controls the reception and manipulation of input data and the output and display of data on output devices. According to the invention, a particular function of microprocessor 916 is to assist in the pillar layout operations.

The memory bus 918 is used by the microprocessor 916 to access the RAM 920 and the ROM 922. The RAM 920 is used by the microprocessor 916 as a general storage area and as scratch-pad memory, and can also be used to store input data and processed data. The ROM 922 can be used to store instructions or program code followed by the microprocessor 916 as well as other data.

The peripheral bus 924 is used to access the input, output, and storage devices used by the digital computer 902. In the described embodiment, these devices include the display screen 904, the printer device 906, the floppy disk drive 908, the hard disk drive 910, and the network interface 912. The keyboard controller 926 is used to receive input from keyboard 914 and send decoded symbols for each pressed key to microprocessor 916 over bus 928.

The display screen 904 is an output device that displays images of data provided by the microprocessor 916 via the peripheral bus 924 or provided by other components in the computer system 900. The printer device 906 when operating as a printer provides an image on a sheet of paper or a similar surface. Other output devices such as a plotter, typesetter, etc. can be used in place of, or in addition to, the printer device 906.

The floppy disk drive 908 and the hard disk drive 910 can be used to store various types of data. The floppy disk drive 908 facilitates transporting such data to other computer systems, and hard disk drive 910 permits fast access to large amounts of stored data.

The microprocessor 916 together with an operating system operate to execute computer code and produce and use data. The computer code and data may reside on the RAM 920, the ROM 922, or the hard disk drives 910. The computer code and data could also reside on a removable program medium and loaded or installed onto the computer system 900 when needed. Removable program mediums include, for example, CD-ROM, PC-CARD, floppy disk and magnetic tape.

The network interface 912 is used to send and receive data over a network connected to other computer systems. An interface card or similar device and appropriate software implemented by the microprocessor 916 can be used to connect the computer system 900 to an existing network and transfer data according to standard protocols.

The keyboard 914 is used by a user to input commands and other instructions to the computer system 900. Other types of user input devices can also be used in conjunction with the present invention. For example, pointing devices such as a computer mouse, a track ball, a stylus, or a tablet can be used to manipulate a pointer on a screen of a general-purpose computer.

The invention can also be embodied as computer readable code on a computer readable medium. The computer readable medium is any data storage device that can store data which can be thereafter be read by a computer system. Examples of the computer readable medium include read-only memory, random-access memory, CD-ROMs, magnetic tape, optical data storage devices. The computer readable medium can also be distributed over a network coupled computer systems so that the computer readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An apparatus for generating mask data suitable to produce a support pillar mask used in air dielectric interconnect structures, comprising:

a mask data scanner configured to select features having an interconnect dimension from a first mask, the features having the interconnect dimension being defined to electrically interconnect devices distributed on a substrate; and a mask data comparator for comparing mask data associated with an intermediate support pattern and mask data associated with the features having the interconnect dimension selected by the mask data scanner, the mask data comparator configured to identify a mask area where the intermediate support pattern and the features having the interconnect dimension overlap, the mask area defining the location of a plurality of pillars.

2. An apparatus for generating mask data as recited in claim 1, wherein the intermediate support pattern is used to define a predetermined pillar spacing for the plurality of pillars.

3. An apparatus for generating mask data as recited in claim 1, further comprising:

a filtering unit for identifying and removing features in the plurality of pillars having at least one dimension that is less than the interconnect dimension selected by the mask data scanner.

4. An apparatus for generating mask data as recited in claim 1, wherein the interconnect dimension has at least an x-direction coordinate and a y-direction coordinate.

5. A computer readable media containing program instructions for automating support pillar layout for air dielectric interconnect structures, the air dielectric interconnect structures being configured to lie above a substrate, the computer readable media comprising:

program instructions for selecting features having an interconnect dimension from a first mask, the features having the interconnect dimension being configured to electrically interconnect devices distributed on the substrate;

program instructions for providing an intermediate support pattern that defines a predetermined spacing for a pillar mask layout; and program instructions for identifying overlap regions where the features having an interconnect dimension selected from the first mask overlap the intermediate support pattern, the overlap regions defining the pillar locations in the pillar mask layout.

6. A computer readable media containing program instructions for automating support pillar layout as recited in claim 5, further comprising:

program instructions for filtering the overlap regions to eliminate features having at least one dimension that is less than the interconnect dimension, the filtering being configured to produce a first pillar mask having a plurality of discrete pillar locations that are associated with the pillar mask layout.

\* \* \* \* \*